(12) United States Patent
Jung et al.

(10) Patent No.: US 11,444,066 B2
(45) Date of Patent: Sep. 13, 2022

(54) DISPLAY APPARATUS AND MANUFACTURING METHOD THEREOF

(71) Applicant: SAMSUNG ELECTRONICS CO., LTD., Suwon-si (KR)

(72) Inventors: Youngki Jung, Suwon-si (KR); Jihoon Kang, Suwon-si (KR); Jinho Kim, Suwon-si (KR); Sangmin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/984,216

(22) Filed: Aug. 4, 2020

(65) Prior Publication Data

US 2021/0043616 A1 Feb. 11, 2021

(30) Foreign Application Priority Data

Aug. 9, 2019 (KR) .......................... 10-2019-0097309

(51) Int. Cl.
*H01L 25/16* (2006.01)
*H01L 21/66* (2006.01)
(Continued)

(52) U.S. Cl.
CPC ............ *H01L 25/167* (2013.01); *H01L 22/22* (2013.01); *H01L 24/83* (2013.01);
(Continued)

(58) Field of Classification Search
CPC ............... G09G 3/006; G09G 2330/08; G09G 2300/0804; G09G 3/3233; G09G 3/32;
(Continued)

(56) References Cited

U.S. PATENT DOCUMENTS 10,056,356 B1   8/2018  Liu et al.
2015/0187249 A1*  7/2015  Tani ...................... G09G 3/006
                                                          345/694

(Continued)

FOREIGN PATENT DOCUMENTS

KR    1020170101056 A    9/2017
KR    1020190031047 A    3/2019
KR    1020190053500 A    5/2019

OTHER PUBLICATIONS

Communication dated Nov. 12, 2020 issued by the European Patent Office in application No. 20187510.1.
(Continued)

*Primary Examiner* — Julio J Maldonado
*Assistant Examiner* — Stanetta D Isaac
(74) *Attorney, Agent, or Firm* — Sughrue Mion, PLLC

(57) ABSTRACT

A display apparatus is provided. The display apparatus includes a plurality of anode pads disposed on a substrate and spaced apart from each other along a first direction; a cathode pad disposed on the substrate and spaced apart from the plurality of anode pads along a second direction that crosses the first direction; a plurality of repair anode pads disposed on the substrate, spaced apart from each other along the first direction, and spaced apart from the plurality of anode pads and the cathode pad along the second direction; and a plurality of light emitting diodes (LEDs) disposed on the substrate and spaced apart from each other along the first direction, each of the plurality of LEDs including an anode that is electrically connected to a corresponding anode pad from among the plurality of anode pads and a cathode that is electrically connected to the cathode pad.

16 Claims, 29 Drawing Sheets

(51) Int. Cl.
  *H01L 23/00*      (2006.01)
  *H01L 25/075*     (2006.01)
(52) U.S. Cl.
  CPC .................... *H01L 25/0753* (2013.01); *H01L 2224/83203* (2013.01); *H01L 2224/83801* (2013.01); *H01L 2224/83851* (2013.01)
(58) Field of Classification Search
  CPC ............. G01R 31/2635; H01L 25/167; H01L 25/0753
  See application file for complete search history.

(56) References Cited

U.S. PATENT DOCUMENTS

| | | |
|---|---|---|
| 2018/0197461 A1 | 7/2018 | Lai et al. |
| 2018/0226388 A1 | 8/2018 | Han |
| 2019/0114958 A1 | 4/2019 | Shin et al. |
| 2019/0157340 A1 | 5/2019 | Liao et al. |
| 2019/0181122 A1 | 6/2019 | Hsu et al. |

OTHER PUBLICATIONS

International Search Report (PCT/ISA/210) dated Nov. 30, 2020 issued by the International Searching Authority in International Application No. PCT/KR2020/010434.
Communication dated Dec. 14, 2021, issued by the European Patent Office in counterpart European Application No. 20187510.1.

\* cited by examiner

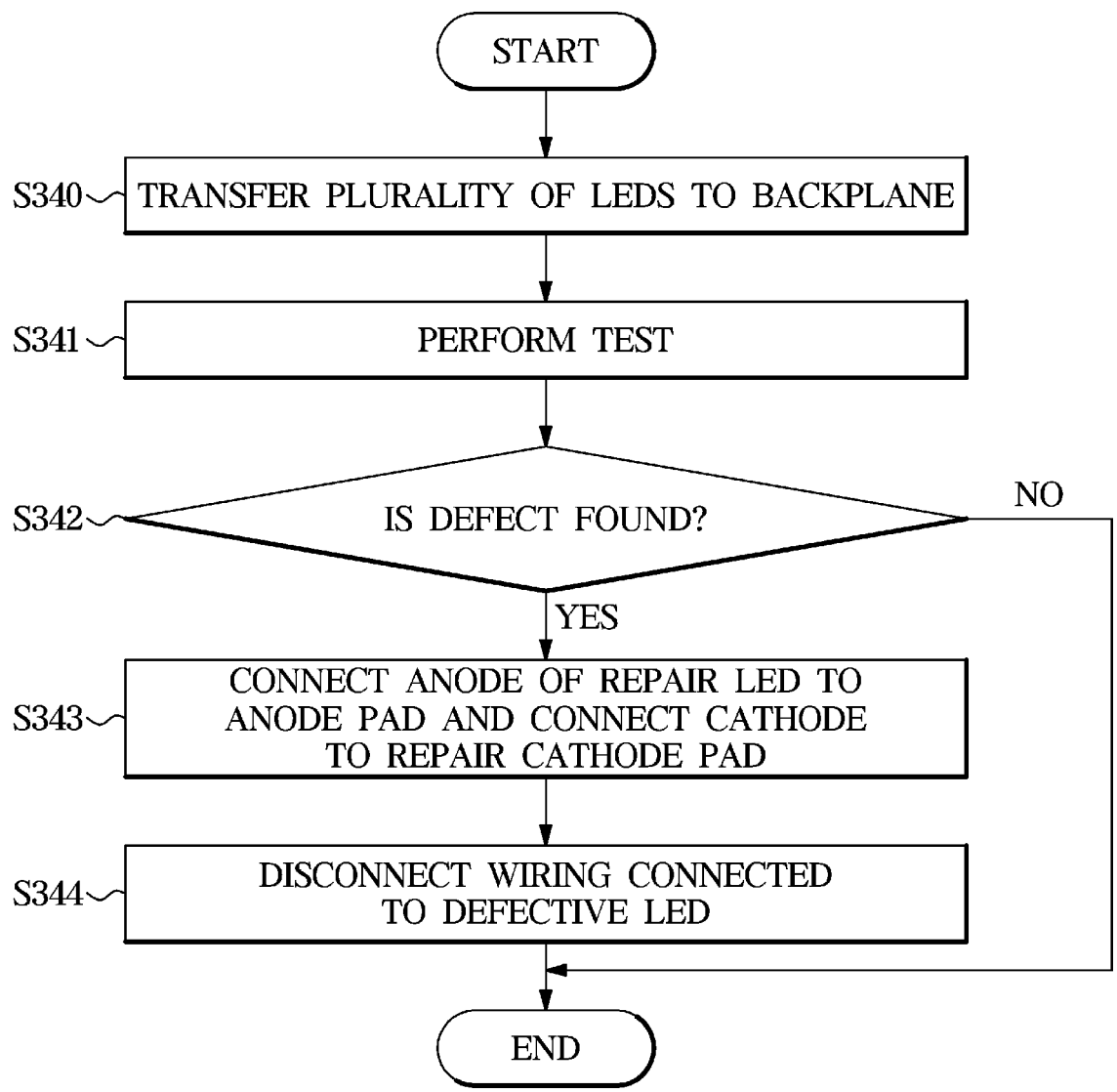

DISPLAY APPARATUS AND MANUFACTURING METHOD THEREOF

CROSS-REFERENCE TO RELATED APPLICATION(S)

This application is based on and claims priority under 35 U.S.C. § 119 to Korean Patent Application No. 10-2019-0097309, filed on Aug. 9, 2019, in the Korean Intellectual Property Office, the disclosure of which is incorporated by reference herein in its entirety

BACKGROUND

1. Field

The disclosure relates to a display apparatus capable of realizing an image using an inorganic light emitting diode and a manufacturing method thereof.

2. Description of Related Art

A display apparatus may be classified into a self-luminous display in which each pixel emits light and a non-self-luminous display that requires a separate light source.

A Liquid Crystal Display (LCD), which is still widely used, is a typical non-self-luminous display, and needs a backlight to supply light from the rear of the display panel, a liquid crystal layer to serve as a switch to transmit/block light, and a color filter to change supplied light to a desired color. The large number of components leads to complexity in the structure and there is a limitation in implementing a small thickness.

On the other hand, a self-luminous display, in which each pixel emits light by itself and includes, for example, a light-emitting diode (LED). The self-luminous display does not need a backlight, a liquid crystal layer, and a color filter. In this regard, the self-luminous display may have a structure with reduced complexity and a high degree of freedom in the design. Further, the self-luminous display may realize a small thickness, better contrast, higher brightness and a better viewing angle.

A micro LED display panel is an example of a self-luminous display and is composed of a plurality of inorganic light emitting diodes (inorganic LEDs) of 100 micrometers or less each. When compared to liquid crystal display panels that require a backlight, the micro LED display panels offer better contrast, response time and energy efficiency. Both the organic light emitting diodes (OLED) and the inorganic micro LEDs have good energy efficiency, but the inorganic micro LEDs have higher brightness, better light emission efficiency, and longer life in comparison with the OLED.

SUMMARY

Provided are a display apparatus capable of reducing a size of a pixel and realizing high resolution by optimizing arrangement between light emitting diodes (LEDs) forming pixels and electrode pads electrically connected to the LEDs, and a manufacturing method thereof.

Embodiments of the disclosure overcome the above disadvantages and other disadvantages not described above. Also, the disclosure is not required to overcome the disadvantages described above, and an embodiment of the disclosure may not overcome any of the problems described above. Additional aspects of the disclosure will be set forth in part in the description which follows and, in part, will be obvious from the description, or may be learned by practice of the disclosure.

In accordance with an aspect of the disclosure, a display apparatus includes: a substrate; a plurality of anode pads disposed on the substrate and spaced apart from each other along a first direction; at least one cathode pad disposed on the substrate and spaced apart from the plurality of anode pads along a second direction that crosses the first direction; a plurality of repair anode pads disposed on the substrate, spaced apart from each other along the first direction, and spaced apart from the plurality of anode pads and the at least one cathode pad along the second direction; and a plurality of light emitting diodes (LEDs) disposed on the substrate and spaced apart from each other along the first direction, each of the plurality of LEDs comprising an anode that is electrically connected to a corresponding anode pad from among the plurality of anode pads and a cathode that is electrically connected to the at least one cathode pad.

The at least one cathode pad may include a single cathode pad commonly connected to the cathode of each of the plurality of LEDs.

The at least one cathode pad may be interposed between the plurality of anode pads and the plurality of repair anode pads.

The at least one cathode pad may include a shared cathode pad commonly connected to the cathode of at least two of the plurality of LEDs.

The plurality of LEDs may include red LED, a green LED and a blue LED, and the at least one cathode pad may include: a first cathode pad electrically connected the green LED and the cathode of the blue LED; and a second cathode pad electrically connected to the cathode of the red LED.

A first reference voltage may be provided to the first cathode pad and a second reference voltage, which is higher than the first reference voltage, may be provided to the second cathode pad.

The display apparatus may include an upper insulating layer disposed on the plurality of anode pads and the plurality of repair anode pads. A connection hole may be formed through the upper insulating layer to expose the plurality of anode pads and the plurality of repair anode pads.

The anode of each of the plurality of LEDs may be electrically connected to the corresponding anode pad exposed through the connection hole.

The display apparatus may include: a repair LED corresponding to a defective LED. A repair anode pad corresponding to the defective LED, from among the plurality of repair anode pads may be electrically connected to the repair anode pad and is exposed through the connection hole.

Each of the plurality of LEDs may be configured to emit light toward away from the substrate.

One of the plurality of anode pads may be electrically connected to one of the plurality of repair anode pads.

In accordance with an aspect of the disclosure, a display apparatus includes: a substrate; a plurality of anode pads disposed on the substrate and spaced apart from each other along a first direction; at least one cathode pad disposed on the substrate and spaced apart from the plurality of anode pads along a second direction that crosses the first direction; at least one repair cathode pad disposed on the substrate and spaced apart from the plurality of anode pads and the at least one cathode pad along the second direction; and a plurality of light emitting diodes (LEDs) disposed on the substrate and spaced apart from each other along the first direction, each of the plurality of LEDs comprising an anode that is electrically connected to a corresponding anode pad from among the plurality of anode pads and a cathode that is electrically connected to the at least one cathode pad. The plurality of anode pads may be interposed between the at least one cathode pad and the at least one repair cathode pad.

The display apparatus may include: a plurality of driving transistors disposed on an upper side of the substrate and corresponding to the plurality of LEDs, respectively. Each of the plurality of anode pads may be electrically connected to a drain electrode of a corresponding driving transistor from among the plurality of driving transistors, and the at least one cathode pad may be connected to a reference voltage.

The display apparatus may include: an upper insulating layer disposed on the plurality of anode pads, the at least one cathode pad and the at least one repair cathode pad. A connection hole may be formed through the upper insulating layer to expose the plurality of anode pads, the at least one cathode pad, and the at least one repair cathode pad.

The anode of each of the plurality of LEDs may be electrically connected to the plurality of anode pads exposed through the connection hole, and the cathode of each of the plurality of LEDs may be electrically connected to the at least one cathode pad exposed through the connection hole.

The display apparatus may include a repair LED corresponding to a defective LED. A cathode of the repair LED may be electrically connected to the at least one repair cathode pad, which is exposed through the connection hole, corresponding to the defective LED, and an anode of the repair LED may be electrically connected to the corresponding anode pad, which is exposed through the connection hole, from among the plurality of anode pads that corresponds to the defective LED.

The display apparatus may include a plurality of driving transistors disposed on an upper side of the substrate and corresponding to the plurality of LEDs, respectively. The at least one cathode pad may be electrically connected to a drain electrode of each of the plurality of driving transistors, and the plurality of anode pads may be connected to a power voltage.

The power voltage may include a first power voltage and a second power voltage that is lower than the first power voltage, the plurality of LEDs may include a red LED, a green LED and a blue LED, the first power voltage may be provided to the anode of the green LED and the anode of the blue LED, and the second power voltage may be provided to the anode of the red LED.

One of the at least one cathode pad may be electrically connected to one of the at least one repair cathode pad.

In accordance with an aspect of the disclosure, a manufacturing method of a display apparatus includes: disposing a plurality of anode pads on a substrate and spaced apart from each of other along a first direction; disposing at least one cathode pad on the substrate and spaced apart from the plurality of anode pads along a second direction that crosses the first direction; disposing a plurality of repair anode pads on the substrate, spaced apart from each other along the first direction, and spaced apart from the plurality of anode pads and the at least one cathode pad along the second direction; forming an upper insulating layer on the plurality of anode pads, the at least one cathode pad, and the plurality of repair anode pads; forming a connection hole through the upper insulating layer to expose the plurality of anode pads, the at least one cathode pad, and the plurality of repair anode pads; and disposing a plurality of light emitting diodes (LEDs) on the substrate and spaced apart from each other along the first direction, each of the plurality of LEDs comprising an anode and a cathode.

The manufacturing method may include: electrically connecting the anode of each of the plurality of LEDs to a corresponding anode pad from among the plurality of anode pads exposed through the connection hole; and electrically connecting the cathode of each of the plurality of LEDs to the at least one cathode pad exposed through the connection hole.

The electrically connecting the anode of each of the plurality of LEDs to the corresponding anode pad may include: forming an anisotropic conductive film on the upper insulating layer; compressing the anode of each of the plurality of LEDs on the anisotropic conductive film at a position corresponding to the corresponding anode pad; and applying heat to the anisotropic conductive film.

One of the plurality of anode pads may be electrically connected to one of the plurality of repair anode pads.

In accordance with an aspect of the disclosure, a display apparatus includes: a first plurality of connection pads formed on a substrate, the first plurality of connection pads being spaced apart from each other along a first direction; a second plurality of connection pads formed on the substrate, the second plurality of connection pads being spaced apart from each other along the first direction and spaced apart from the first plurality of connection pads along a second direction that crosses the first direction, one of the first plurality of connection pads being electrically connected to one of the second plurality of connection pads; a third plurality of connection pads formed on the substrate, the third plurality of connection pads being spaced apart from each other along the first direction and interposed between the first plurality of connection pads and the second plurality of connection pads along the second direction; and a first light emitting diode (LED) disposed on and electrically connected to the one of the first plurality of connection pads and one of the third plurality of connection pads, wherein the first LED is offset from the one of the second plurality of connection pads along the first direction and the second direction.

The display apparatus may include: a second LED disposed on and electrically connected to another one of the first plurality of connection pads and another one of the third plurality of connection pads; and a repair LED disposed on and electrically connected to another one of the second plurality of connection pads and the another one of the third plurality of connection pads. The another one of the first plurality of connection pads may be electrically isolated from the another one of the second plurality of connection pads.

The second LED may be a defective LED.

The display apparatus may include an insulating layer formed on the first plurality of connection pads, the second plurality of connection pads and the third plurality of connection pads. The one of the second plurality of connection pads may be exposed through the insulating layer.

BRIEF DESCRIPTION OF THE DRAWINGS

The above and other aspects, features and advantages of certain embodiments will become apparent from the following description, taken in conjunction with the accompanying drawings in which:

FIG. 29 is a flowchart illustrating another method for transferring the LED to the backplane and testing the LED in a manufacturing method of the display apparatus according to an embodiment.

DETAILED DESCRIPTION

Figure 1:
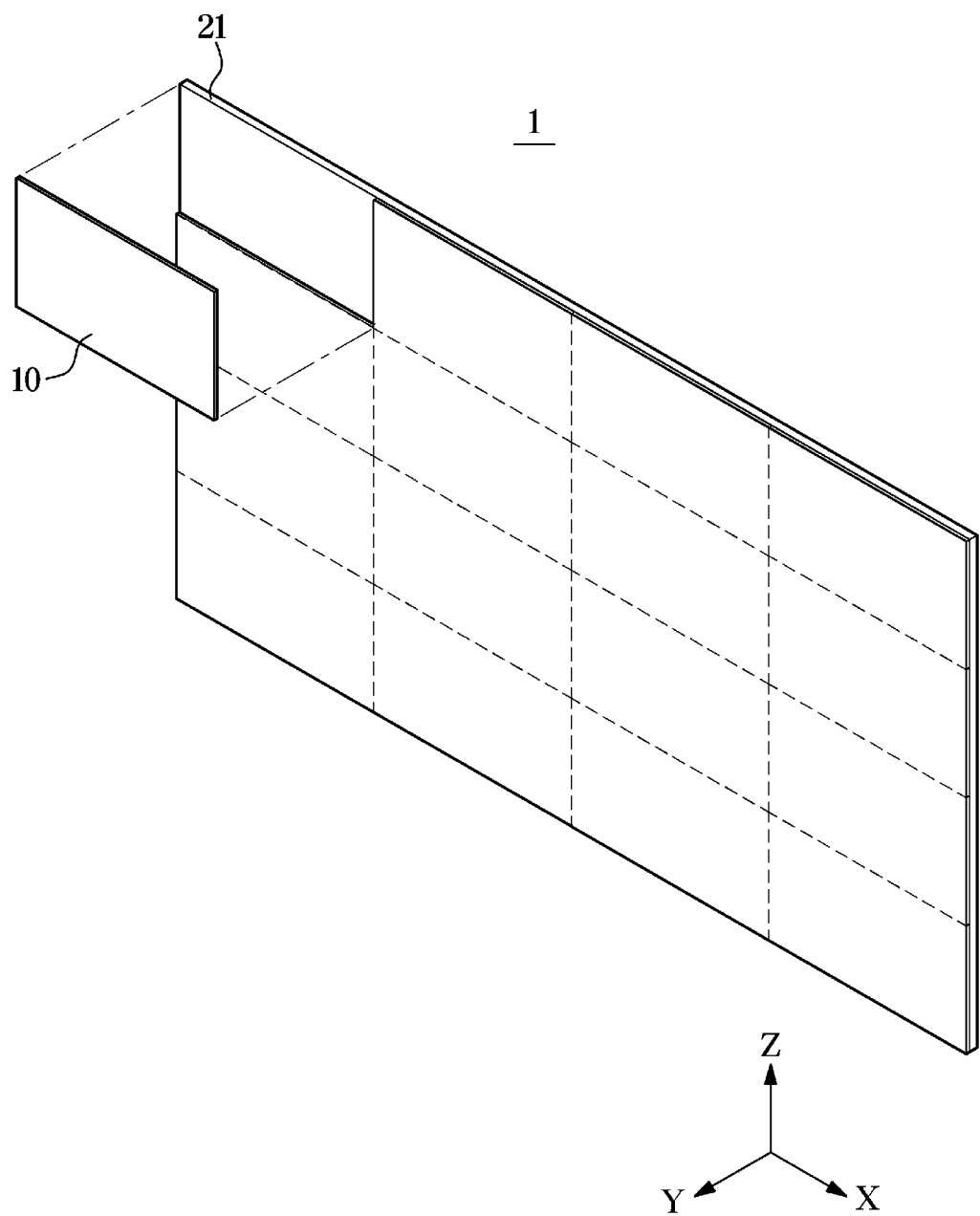
FIG. 1 is a perspective view illustrating an example of a display apparatus according to an embodiment.

In the following description, like reference numerals refer to like elements throughout the specification. Well-known functions or constructions may not be described in detail because they would obscure the one or more embodiments with unnecessary detail. Terms such as "unit", "module", "member", and "block" may be embodied as hardware or software. According to embodiments, a plurality of "units", "modules", "members", and "blocks" may be implemented as a single component or a single "unit", "module", "member", and "block" may include a plurality of components.

It will be understood that when an element is referred to as being "connected" to another element, it can be directly or indirectly connected to the other element, wherein the indirect connection includes "connection via a wireless communication network" or "electrical connection through an electrical wiring".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Throughout the description, when a component transfers or transmits a signal or data to another component, it is noted that there is another component between the component and the other component and the signal or data is transferred or transmitted through the component, unless there is a particular description contrary thereto.

It will be understood that, although the terms "1st" or "first", and "2nd" or "second", may use corresponding components regardless of importance or order and are used to distinguish one element from another element without limiting the components.

As used herein, the singular forms "a," "an" and "the" are intended to include the plural forms as well, unless the context clearly indicates otherwise.

An identification code is used for the convenience of the description but is not intended to illustrate the order of each operation. Each operation may be implemented in the order different from the illustrated order unless the context clearly indicates otherwise.

Hereinafter embodiments of a display apparatus and a manufacturing method thereof will be described in detail with reference to the accompanying drawings.

Figure 2:
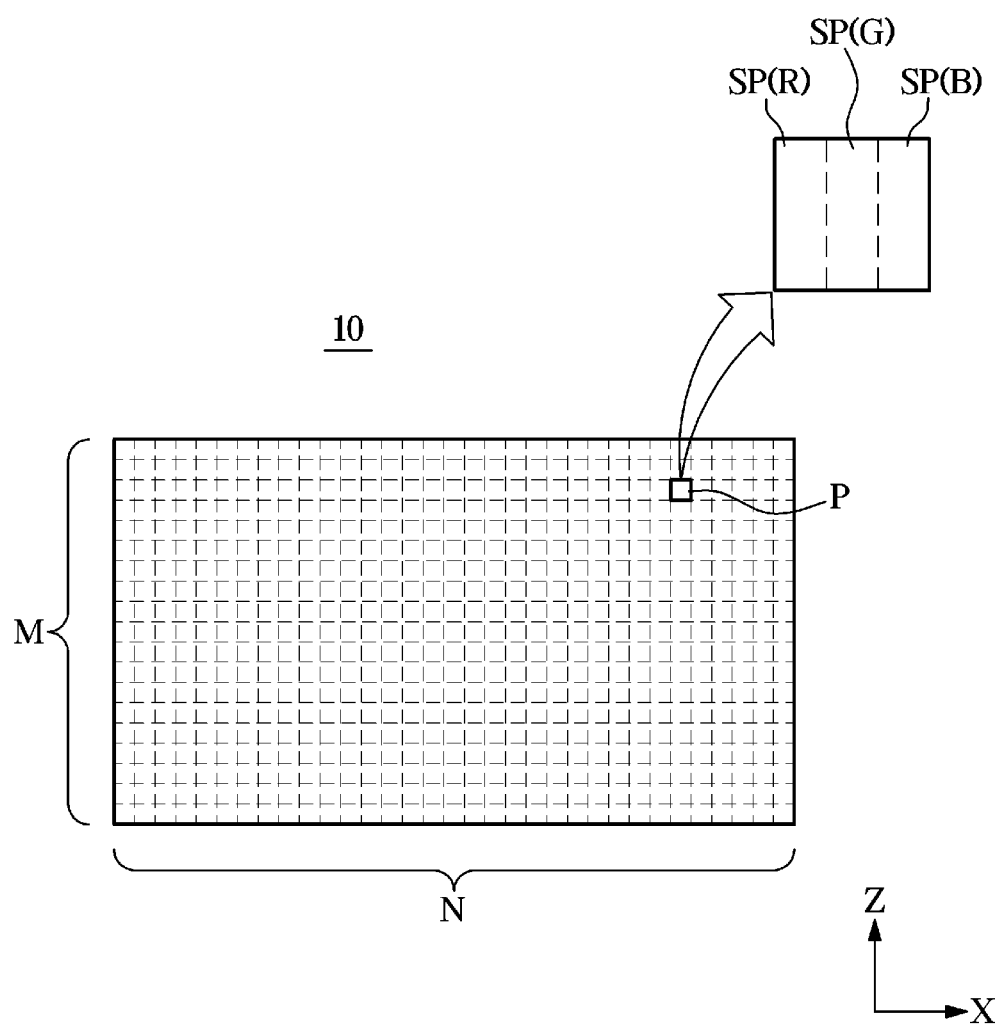
FIG. 2 is a view illustrating an example of a pixel forming a unit module of the display apparatus according to an embodiment.

FIG. 1 is a perspective view illustrating an example of a display apparatus according to an embodiment and FIG. 2 is a view illustrating an example of a pixel forming a unit module of the display apparatus according to an embodiment.

A display apparatus according to an embodiment is a self-luminous display apparatus in which a light-emitting diode (LED) is disposed for each pixel so that each pixel emits light by itself. Therefore, unlike a liquid crystal display (LCD) apparatus, because a component such as a backlight unit, a liquid crystal layer, and a polarizing plate is not required, it is possible to realize a small thickness, and a design may vary die to the reduced structural complexity.

In addition, the display apparatus according to an embodiment may employ an inorganic light emitting device, such as a light emitting diode (LED), as a light emitting device disposed in each pixel. The inorganic light emitting device has a faster reaction speed than an organic light emitting device such as an organic light emitting diode (OLED), and may realize high luminance with low power. In addition, in comparison with the OLED that requires an encapsulation process because the OLED is vulnerable to exposure to water and oxygen and has poor durability, the inorganic LED may not require the encapsulation process and have better durability.

The inorganic light emitting device employed in the display apparatus according to an embodiment may be a micro LED having a short side length of about 125 μm. As described above, by employing the micro-unit LED, it is possible to reduce the pixel size and increase pixel density to realize high resolution.

A display apparatus employing a micro LED may be applied to various fields using an ultra-small pixel size and a small thickness. For example, as shown in FIG. 1, by tiling a plurality of unit modules 10, each of which includes a plurality of micro LEDs mounted on a substrate, and by installing the plurality of unit modules 10 to a cabinet 21, it is possible to realize a large area screen.

In addition, a three-dimensional coordinate system of the XYZ axis shown in FIG. 1 is based on the display apparatus 1, a plane on which a screen of the display apparatus 1 is located is a X-Z plane, and a direction in which an image is output or an inorganic light emitting device emits light is +Y direction. Because the coordinate system is based on the display apparatus 1, the same coordinate system may be applied to the display apparatus 1 regardless of orientation of the display apparatus 1.

Referring to FIG. 2, the unit module 10 may have a pixel structure of an M×N (M and N are integers of 2 or more) array, and a unit pixel P may be composed of three sub-pixels such as a red sub-pixel SP(R), a green sub-pixel SP (G), and a blue sub-pixel SP (B), which correspond to red R, green G and blue B.

However, the structures of FIGS. 1 and 2 are only examples that may be applied to the display apparatus 1 according to an embodiment, and embodiments are not limited to a display apparatus manufactured by tiling the plurality of unit modules 10. Therefore, the display apparatus 1 may be a display apparatus having an M×N pixel array without a tiling process.

In addition, embodiments are not limited to a unit pixel P that is composed of the red sub-pixel SP (R) configured to emit a red light, the green sub-pixel SP (G) configured to emit a green light, and the blue sub-pixel SP (B) configured to emit a blue light. Therefore, the unit pixel P may include a sub-pixel configured to emit a yellow light and a sub-pixel configured to emit a white light.

For convenience, in embodiments described below, the unit pixel P will be described as including the red sub-pixel SP (R) configured to emit a red light, the green sub-pixel SP (G) configured to emit a green light, and the blue sub-pixel configured to emit a blue light.

Figure 3:
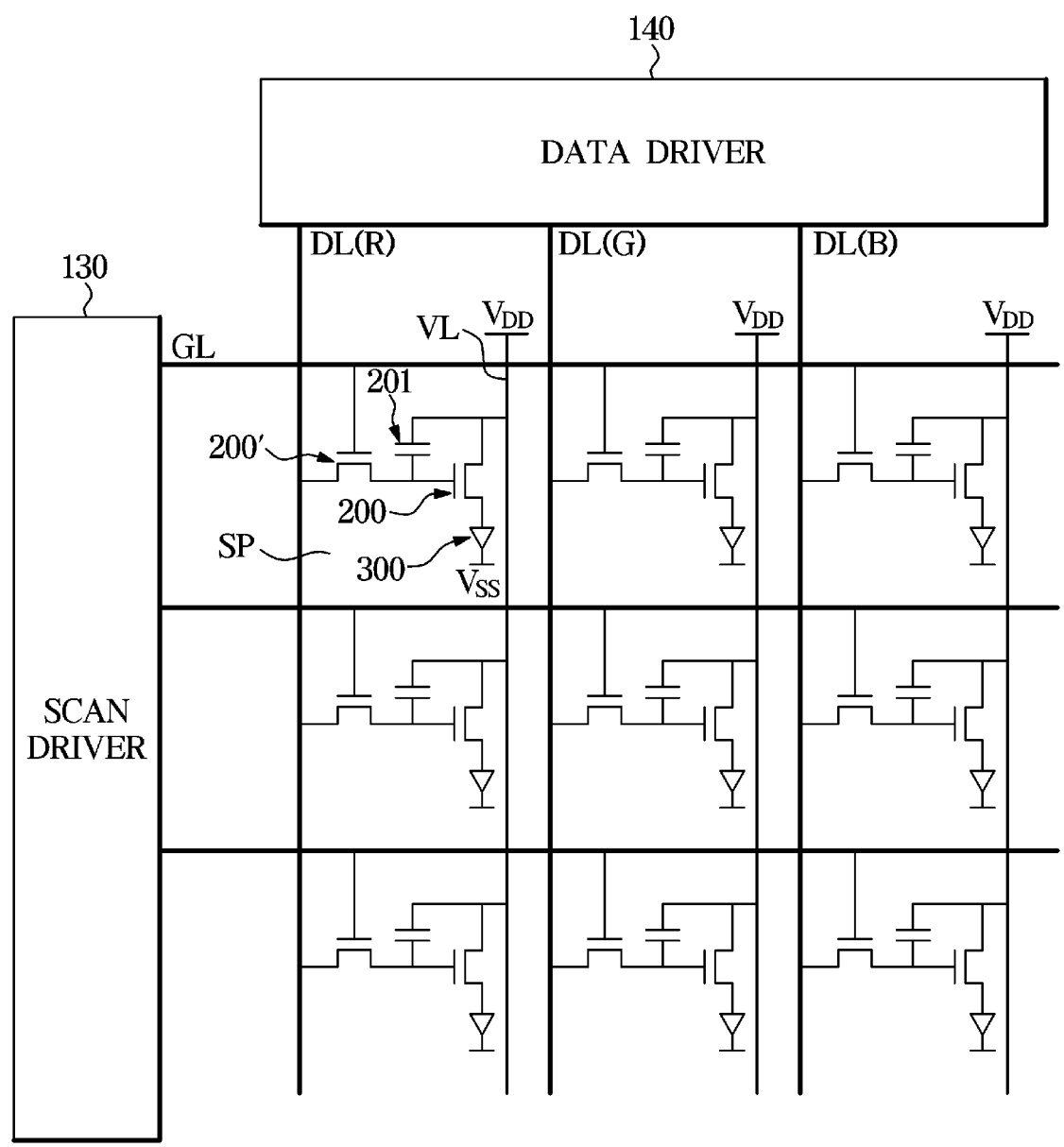
FIG. 3 is a diagram illustrating a thin film transistor (TFT) driver circuit for individually driving each pixel of the display apparatus according to an embodiment.
Figure 4:
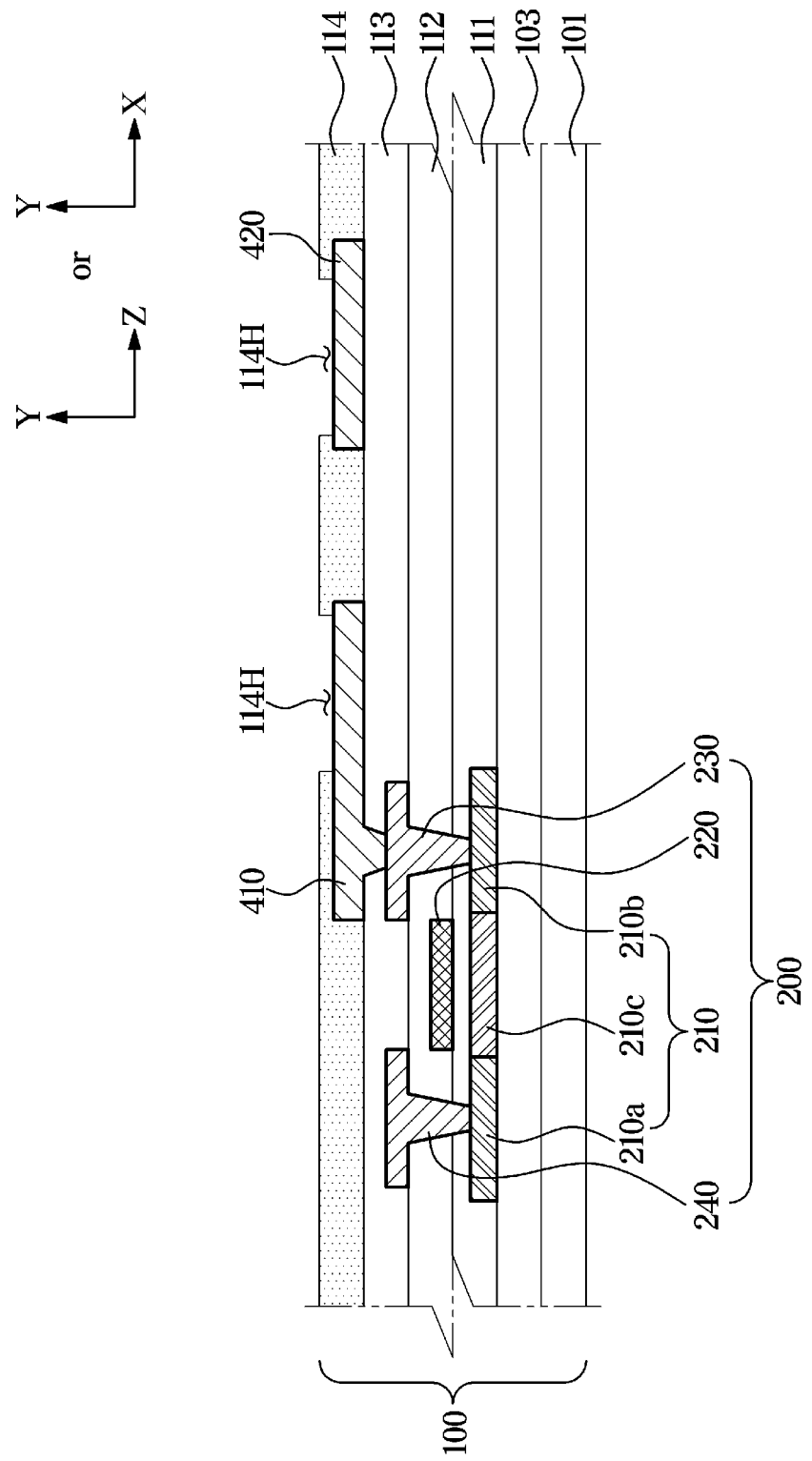
FIG. 4 is a side cross-sectional view illustrating a sub-pixel of the display apparatus according to an embodiment.
Figure 5:
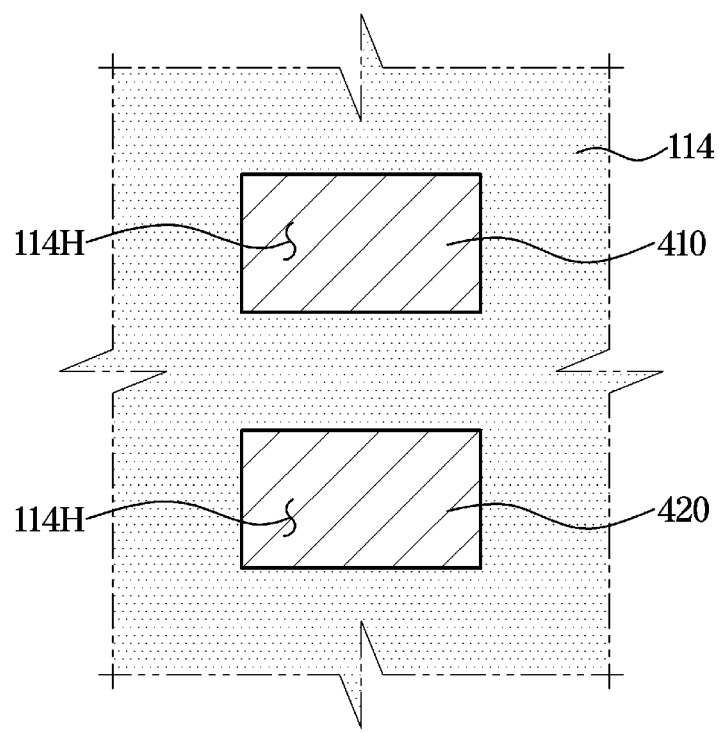
FIG. 5 is a plan view illustrating an anode pad and a cathode pad of the display apparatus according to an embodiment, when viewed above.

FIG. 3 is a diagram illustrating a thin film transistor (TFT) driver circuit for individually driving each pixel of the display apparatus according to an embodiment, FIG. 4 is a side cross-sectional view illustrating a sub-pixel of the display apparatus according to an embodiment, and FIG. 5 is a plan view illustrating an anode pad and a cathode pad of the display apparatus according to an embodiment, when viewed above.

Referring to FIG. 3, a plurality of data lines DL and power lines VL arranged in a column direction, and gate lines GL arranged in a row direction may be provided as an electrode pattern. Regions divided by the data line DL and the gate line GL correspond to the sub-pixels SP.

The data line DL may transmit a data signal for realizing an image to the sub-pixel SP, and the gate line GL may transmit a scan signal for turning on/off the sub-pixel to the sub-pixel SP. The power line VL may supply a power voltage $V_{DD}$ to the sub-pixel for a time corresponding to a single frame.

When a scan driver 130 applies a scan signal to the gate line GL, the sub-pixel SP connected to the gate line GL to which the scan signal is applied may be turned on, and when a data driver 140 applies a data voltage VDATA corresponding to an image signal to the data line DL, the data voltage VDATA may be input to a sub-pixel that is turned on among the sub-pixels connected to the data line DL.

The scan driver 130 and the data driver 140 may be electrically connected to a backplane 100 (refer to FIG. 4). For example, the scan driver 130 and the data driver 140 may be mounted on the backplane 100 in such a way that the scan driver 130 and the data driver 140 in the form of a chip are mounted on a tape carrier package (TCP), a flexible printed circuit (FPC) or a film. Alternatively, the scan driver 130 and the data driver 140 may be directly mounted in a lower side of the backplane 100.

A light emitting diode (LED) 300 configured to supply light to the corresponding sub-pixel may be provided for each sub-pixel. A thin film transistor (TFT) driver circuit configured to drive the LED 300 may include a switching transistor 200', a driving transistor 200, and a capacitor 201.

The switching transistor 200' and the driving transistor 200 may each be implemented as a PMOS type transistor. However, an embodiment of the display apparatus is not limited thereto, and one or both of the switching transistor 200' and the driving transistor 200 may be implemented as an NMOS type transistor.

A gate electrode of the switching transistor 200' may be connected to the gate line GL, a source electrode may be connected to the data line DL, and a drain electrode may be connected to one end of the capacitor 201 and a gate electrode of the driving transistor 200. The other end of the capacitor 201 may be connected to the power line VL.

Figure 6:
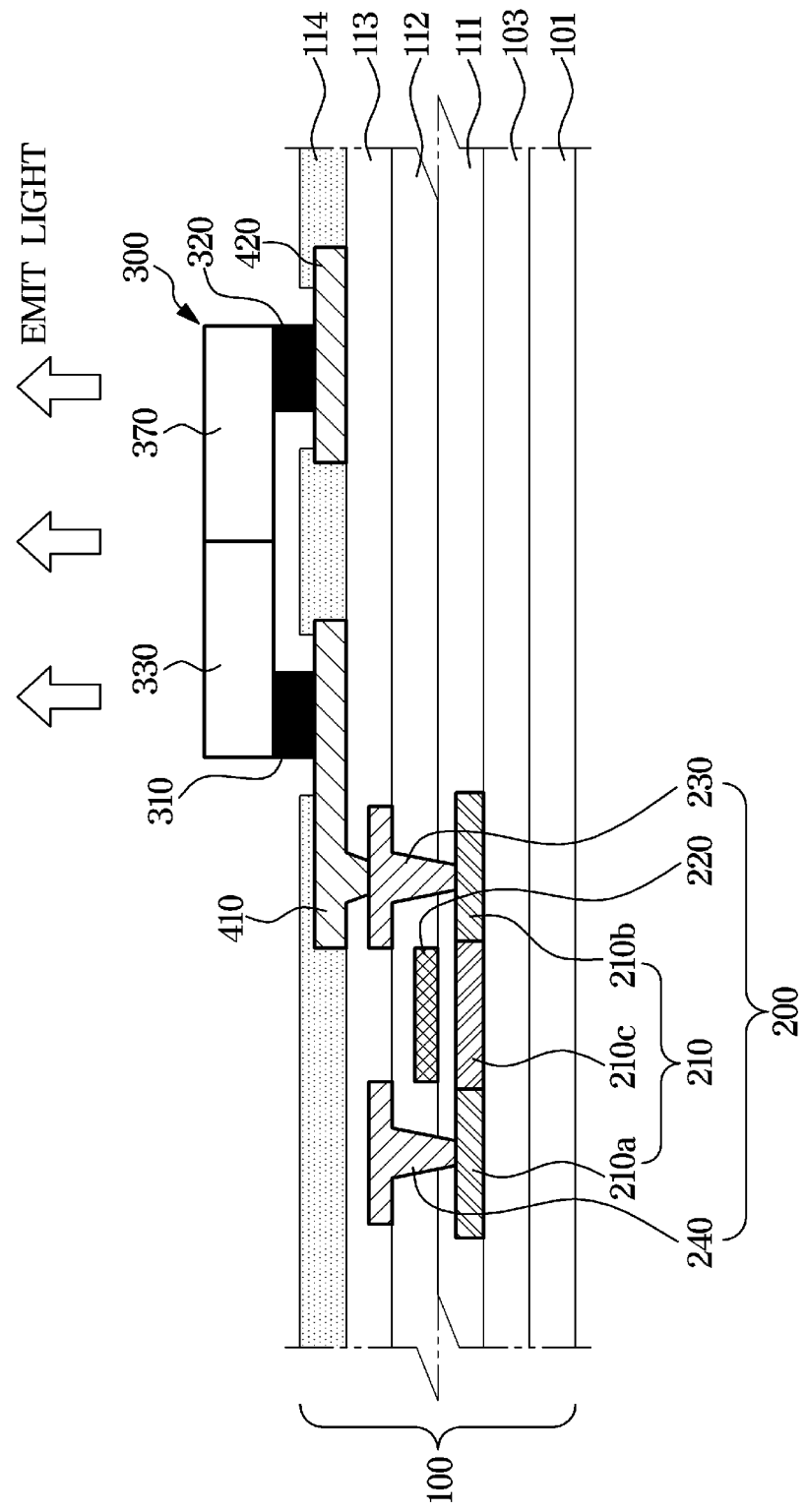
FIG. 6 is a view illustrating an example of a method in which the anode pad and the cathode pad are electrically connected to an inorganic light emitting diode (inorganic LEDs) in the display apparatus according to an embodiment.

In addition, a source electrode of the driving transistor 200 may be connected to the power line VL, and a drain electrode may be connected to an anode 310 of the LED 300 (refer to FIG. 6). A cathode 320 of the LED 300 (refer to FIG. 6) may be connected to a reference voltage $V_{SS}$. The reference voltage $V_{SS}$ may be a voltage at a level lower than the power voltage $V_{DD}$, and a ground voltage may be used as the reference voltage $V_{SS}$.

The sub-pixel including the above-described structure may be operated as follows. First, when a scan signal is applied to the gate line GL to turn on the switching transistor 200', the data voltage VDATA applied to the data line DL may be applied to one end of the capacitor 201 and the gate electrode of the driving transistor 200. A voltage corresponding to a gate-source voltage VGS of the driving transistor 200 may be maintained for a predetermined time by the capacitor 201. The driving transistor 200 may allow the LED 300 to emit light by applying a driving current IGS corresponding to the gate-source voltage VGS to the anode 310 of the LED 300.

At this time, when a high data voltage VDATA is transmitted to the gate electrode of the driving transistor 200, the gate-source voltage VGS of the driving transistor 200 may be lowered, and thus a small amount of driving current IGS may be applied to the anode 310 of the LED 300. Therefore, the LED 300 may display a low gradation. On the other hand, when a low data voltage VDATA is transmitted, the gate-source voltage VGS of the driving transistor 200 may be increased, and thus a large amount of driving current IGS may applied to the anode 310 of the LED 300. Therefore, the LED 300 may display a high gradation.

Referring to FIG. 4, a buffer layer 103 may be formed on a substrate 101, and the driving transistor 200 may be disposed on the buffer layer 103. An upper side of the substrate 101 may indicate +Y direction. A side cross-section according to this embodiment and embodiments described below may be located on an X-Y plane or a Z-Y plane.

The substrate 101 may be formed of various materials. For example, the substrate 101 may be formed of a transparent glass material containing SiO2 as a main component. Alternatively, the substrate 101 may be formed of a transparent plastic material and thus the substrate 101 may have flexibility. As another alternative, the substrate 101 may be formed of a metal material.

The plastic material forming the substrate 101 may be an insulating organic material selected from a group consisting of polyethersulphone (PES), polyacrylate (PAR), polyetherimide (PEI), polyethyelenenaphthalate (PEN), polyethylene terephthalate (PET), polyphenylene sulfide (PPS), polyallylate, polyimide, polycarbonate (PC), cellulose triacetate (TAC), and cellulose acetate propionate (CAP).

The metal forming the substrate 101 may be selected from the group consisting iron, chromium, manganese, nickel, titanium, molybdenum, stainless steel (SUS), invar alloy, inconel alloy and Kovar alloy.

The buffer layer 103 may provide a flat surface on an upper side of the substrate 101 and may prevent foreign substances or moisture from penetrating through the substrate 101. For example, the buffer layer 103 may be formed of an inorganic material such as silicon oxide, silicon nitride, silicon oxynitride, aluminum oxide, aluminum nitride, titanium oxide or titanium nitride, or an organic material such as polyimide, polyester, or acrylic. Alternatively, the buffer layer 103 may include a plurality of laminated layers of the above-mentioned materials.

The driving transistor 200 disposed on the buffer layer 103 may include an active layer 210, a gate electrode 220, a drain electrode 230, and a source electrode 240. The active layer 210 may be formed of a semiconductor material, and the active layer 210 may include a source region 210a, a drain region 210b, and a channel region 210c between the source region and the drain region.

The gate electrode 220 may be formed on the upper side of the active layer 210 to correspond to the channel region 210c. The source electrode 230a and the drain electrode 230b may be electrically connected to the source region 210a and the drain region 210b of the active layer 210, respectively. According to an embodiment, the driving transistor 200 is implemented in a top gate type in which the gate electrode 220 is arranged in the upper side of the active layer 210. However, embodiments are not limited thereto, and the gate electrode 220 may be arranged on a lower side of the active layer 210.

A first insulating layer 111 formed of an inorganic insulating material may be arranged between the active layer 210 and the gate electrode 220. A second insulating layer 112 may be arranged on the gate electrode 220. The first insulating layer 111 may be a gate insulating layer, and the second insulating layer 112 may be an interlayer insulating layer. In this embodiment, the arrangement of one component on another component may represent not only a structure in which all of the components are located on top of the other components, but also a structure in which one component surrounds or covers all or part of the other components. In addition, the fact that one component covers another component may represent not only a structure in which one component covers all other components, but also a structure in which a hole is formed in one component and a part of the other component is exposed through the corresponding hole.

Therefore, the gate insulating layer 111 may be formed on the buffer layer 103, on which the active layer 210 is disposed, to cover the active layer 210. The interlayer insulating layer 112 may be formed on the gate insulating layer 111, on which the gate electrode 220 is disposed, to cover the gate electrode 220.

The source electrode 240 and the drain electrode 230 may be disposed on the interlayer insulating layer 112. A hole may be formed through the interlayer insulating layer 112 and the gate insulating layer 111 at positions corresponding to the source electrode 240 and the drain electrode 230. The source electrode 240 and the drain electrode 230 may be electrically connected to the source region 210a and the drain region 210b of the active layer 210 through holes, respectively. In this embodiment, "electrically connected" may represent not only a case in which conductive material, in which a current flows, are directly soldered, but also a case in which when it is connected through a separate wire, it is disposed between layers, in which a current flows, such as an anisotropic conductive film (ACF). That is, there is no limitation in a specific connection method as long as a current flows between two components in contact with each other. Further, in the embodiments described below, the connection between certain components may include a case in which components are electrically connected.

A third insulating layer 113 may be disposed on the interlayer insulating layer 112 on which the source electrode 240 and the drain electrode 230 are disposed. The third insulating layer 113 may be a planarization layer. The planarization layer 113 may be disposed on the interlayer insulating layer 112, and may cover the source electrode 240, the drain electrode 230 and the interlayer insulating layer 112.

An anode pad 410 connected to the anode 310 of the LED 300 (refer to FIG. 6) and a cathode pad 420 connected to the cathode 320 of the LED 300 (refer to FIG. 6) may be disposed on the planarization layer 113. In this embodiment, the anode pad 410 and the cathode pad 420 may represent an electrode pad formed of a conductive material such as metal, and exposed from an insulating layer so as to be electrically connected to other electrodes. In embodiments described below, the term pad is used only for an electrode pad on the backplane 100 side, and an electrode pad on the LED side is referred to as an anode and a cathode.

A hole may be formed at a position of the interlayer insulating layer 113 corresponding to the drain electrode 230, and the anode pad 410 may be electrically connected to the drain electrode 230 through the hole. The source electrode 240 may be connected to the power supply line VL to which the power voltage $V_{DD}$ is supplied, and the gate electrode 220 may be connected to a line to which the data voltage VDATA is supplied.

The cathode pad 420 may be connected to the reference voltage $V_{SS}$ to provide the ground to the LED 300 connected to the cathode pad 420.

An upper insulating layer 114 may be disposed on the interlayer insulating layer 113 on which the anode pad 410 and the cathode pad 420 are disposed. The upper insulating layer 114 may cover the interlayer insulating layer 113, the anode pad 410, and the cathode pad 420.

In this embodiment, the insulating layers disposed on an upper side of the substrate 101 may be formed of an organic insulating material or an inorganic insulating material, or may be alternately formed of the organic insulating material and the inorganic insulating material.

Referring to FIGS. 4 and 5, connection holes 114H may be formed through the upper insulating layer 114 covering the anode pad 410 and the upper insulating layer 114 covering the cathode pad 420.

The anode pad 410 and the cathode pad 420 may be exposed through the connection holes 114H formed through the upper insulating layer 114, and the anode 310 and the cathode 320 of the LED 300 may be electrically connected to the anode pad 410 and the cathode pad 420 which are exposed through the connection holes 114H.

A structure from the substrate 101 to the upper insulating layer 114 may be referred to as the backplane 100, and the unit module 10 of the display apparatus 1 may be manufactured by transferring the LED 300 to an upper side of the backplane 100.

Figure 7:
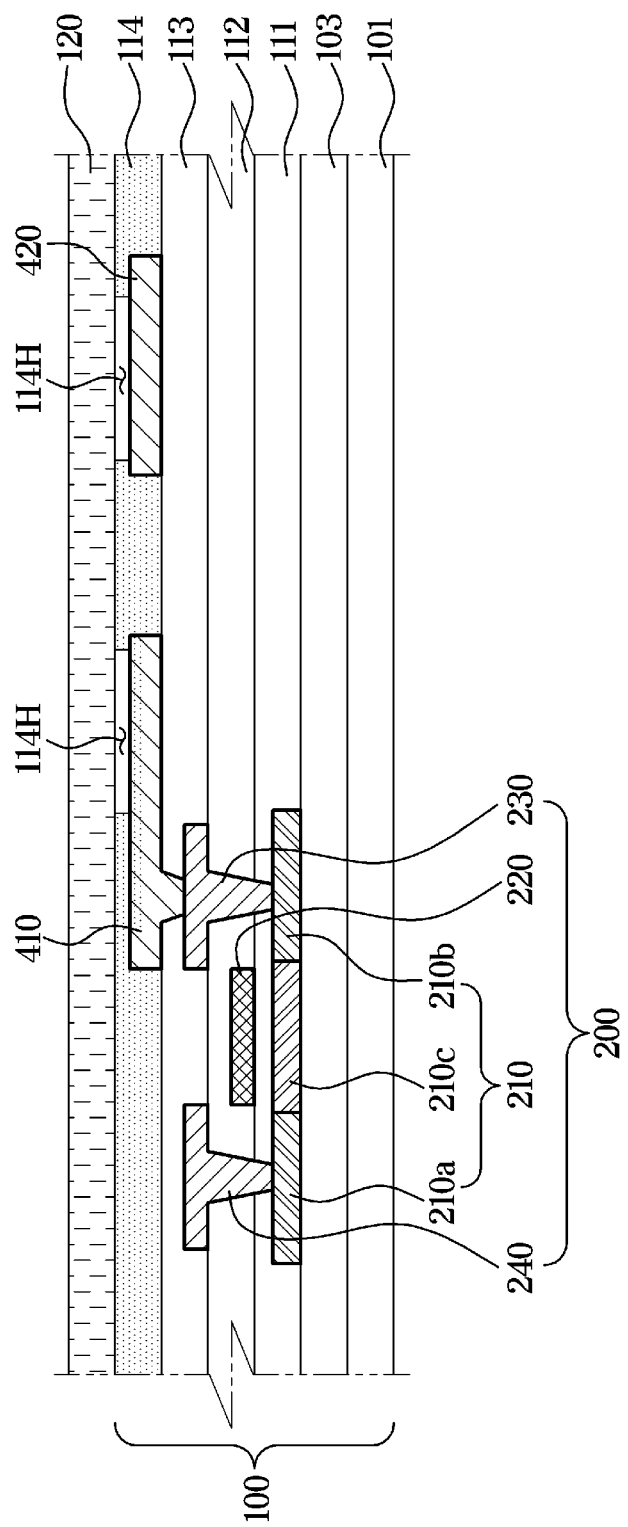
FIG. 7 is a view illustrating an example of a method in which the anode pad and the cathode pad are electrically connected to the inorganic LEDs in the display apparatus according to an embodiment.

FIGS. 6 and 7 are views illustrating an example of a method in which the anode pad and the cathode pad are electrically connected to an inorganic light emitting diode (inorganic LEDs) in the display apparatus according to an embodiment.

Referring to FIG. 6, the LED 300 may include a p-n diode, the anode 310 and the cathode 320. The anode 310 and the cathode 320 may be formed of various conductive materials such as metal, conductive oxide, and conductive polymer. The anode 310 may be electrically connected to the anode pad 410 of the backplane 100, and the cathode 320 may be electrically connected to the cathode pad 420 of the backplane 100.

The p-n diode may include a p-doped portion 330 on the anode 310 side, an n-doped portion 370 on the cathode 320 side, and a quantum well between the p-doped portion 330 and the n-doped portion 370. Alternatively, it is possible to employ an inorganic LED in which a doped portion on the cathode 320 side is a p-doped portion and a doped portion on the anode 310 side is an n-doped portion.

Further, the display apparatus 1 according to an embodiment is a front emission type display apparatus in which light is emitted in the opposite direction of the substrate 101. Therefore, a driving current may be applied to the anode 310 of the LED 300 through the anode pad 410, and when a current flows from the anode 310 to the cathode 320, the LED 300 may emit light in a direction opposite to the substrate 101 that is the +Y direction.

As mentioned above, the electrical connection between the electrodes may be performed in a variety of bonding methods. For example, a bonding method using an anisotropic conductive film (ACF) may be applied.

Referring to FIG. 7, an anisotropic conductive film (ACF) 120 may be disposed on the upper insulating layer 114 through which the connection holes 114H are formed. The ACF 120 may be manufactured by uniformly dispersing conductive particles in an adhesive organic material having insulating properties and by manufacturing it in the form of a film. Particularly, the ACF 120 has conductivity in a thickness direction of the film and insulation in a surface direction.

When heat is applied to the ACF 120 and the LED 300 is compressed on the ACF 120, the ACF 120 may become conductive and allow a current to flow in the thickness direction of the film to which the pressure is applied. For example, because the LED applies pressure to the ACF 120 at positions corresponding to the holes 114H, the ACF 120 may become conductive at these positions. Accordingly, the ACF 120 may electrically connect the anode 310 of the LED 300 to the anode pad 410, and may electrically connect the cathode 320 of the LED 300 to the cathode pad 420. If pressure is not applied to the portion of the ACF 120 interposed between the holes 114H, the portion will not become conductive.

As mentioned above, the LED 300 may be implemented as a micro-LED, and a plurality of LEDs may be picked up from a wafer by a transport mechanism and then transferred to the substrate 101, particularly, the backplane. It is possible to simultaneously transfer the plurality of LEDs to the backplane by compressing the plurality of LEDs on the ACF 120 at once.

However, the electrical connection between the LED 300 and the backplane 100 is not limited to the bonding method by the ACF 120. Alternatively, it is also possible to electrically connect the LED 300 and the anode pad 410 and the cathode pad 420 by soldering using a metal ink such as silver (Ag), gold (Au), or copper (Cu).

After transferring the LED 300 to the backplane 100, a test may be performed to identify whether the LED 300 is defective. As a result of the test, when there is a defect such as a case in which the LED 300 transferred to the backplane does not emit light normally, a repair inorganic LED 300' corresponding to the defective LED 300 may be mounted on the backplane 100.

The repair LED emits the same color as the defective LED 300. For example, when the defective LED 300 is a red inorganic LED, the repair LED also uses a red inorganic LED, and when the defective LED 300 is a green inorganic LED, the repair LED also uses a green inorganic LED. When the defective LED 300 is a blue inorganic LED, the repair LED also uses a blue inorganic LED.

A region to which a repair LED 300' is mounted may be provided on the backplane 100 in order to mount the repair LED in response to the occurrence of the defective LED 300. Hereinafter a structure related to this will be described in detail.

Figure 8:
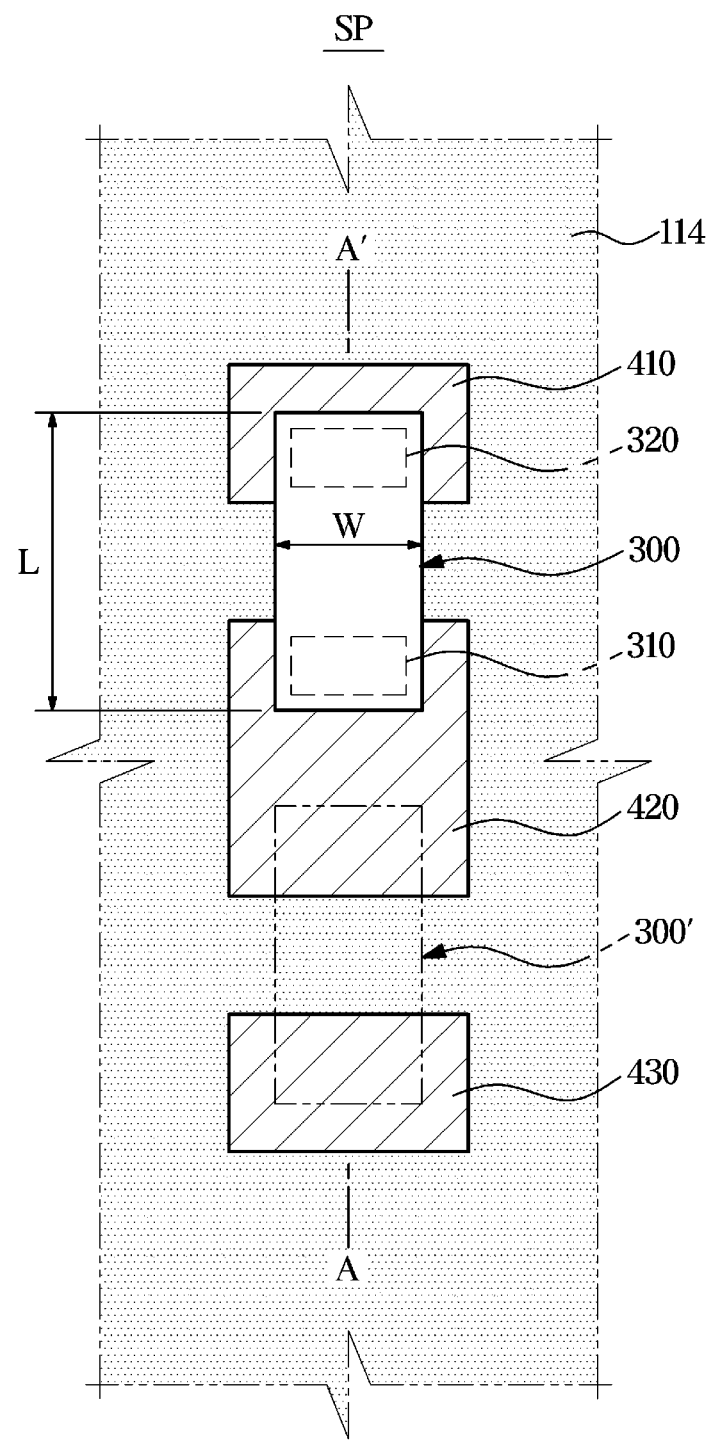
FIG. 8 is a view illustrating a pad structure for a single repair LED in the display apparatus according to an embodiment when viewed above.
Figure 9:
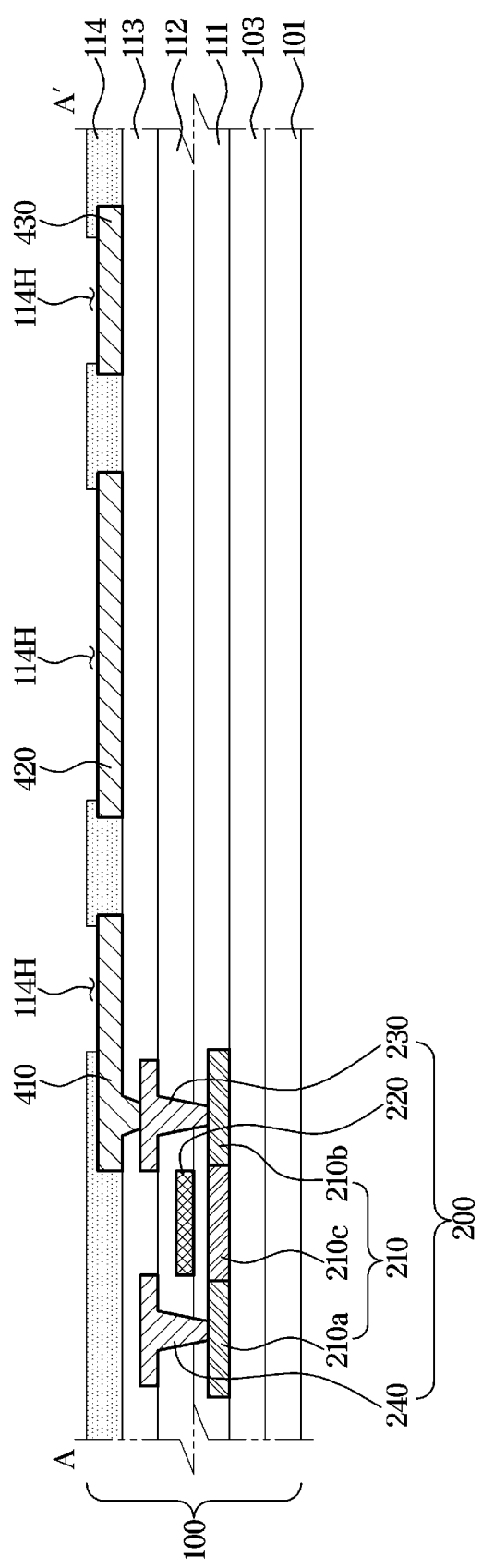
FIG. 9 is a side cross-sectional view illustrating the pad structure for the single repair LED in the display apparatus according to an embodiment.
Figure 10:
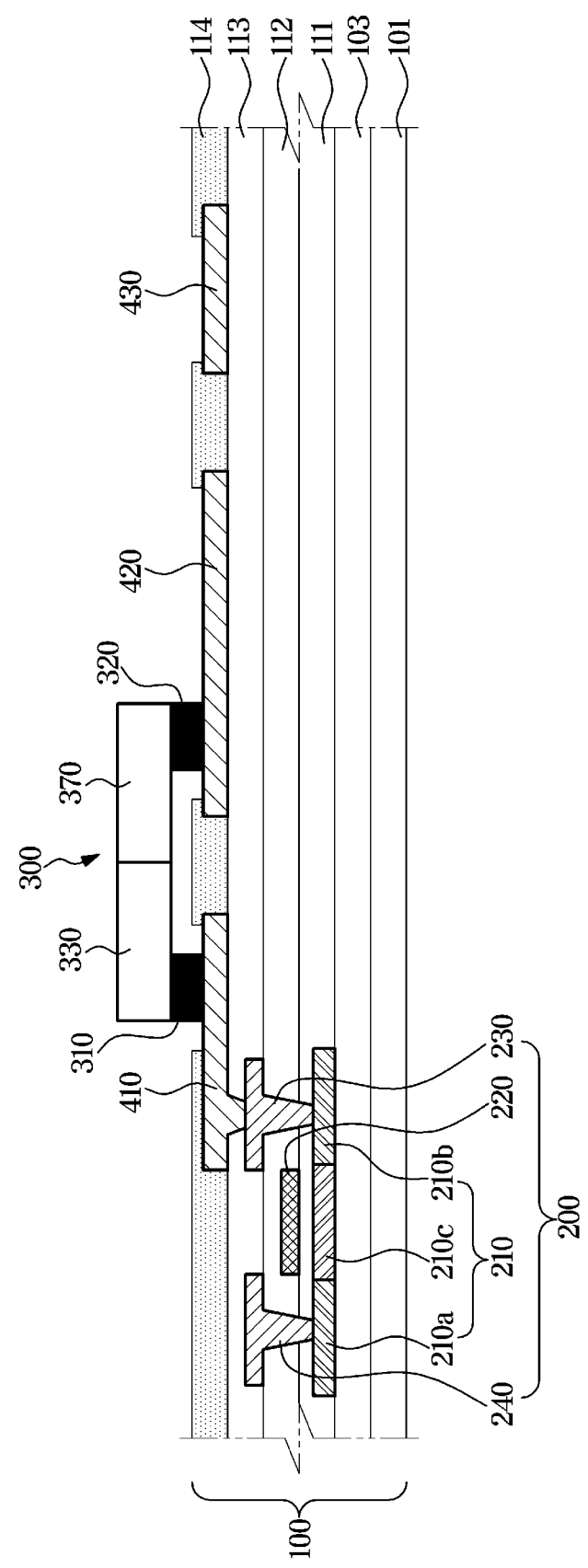
FIG. 10 is a side cross-sectional view illustrating the pad structure for the single repair LED in the display apparatus according to an embodiment.
Figure 11:
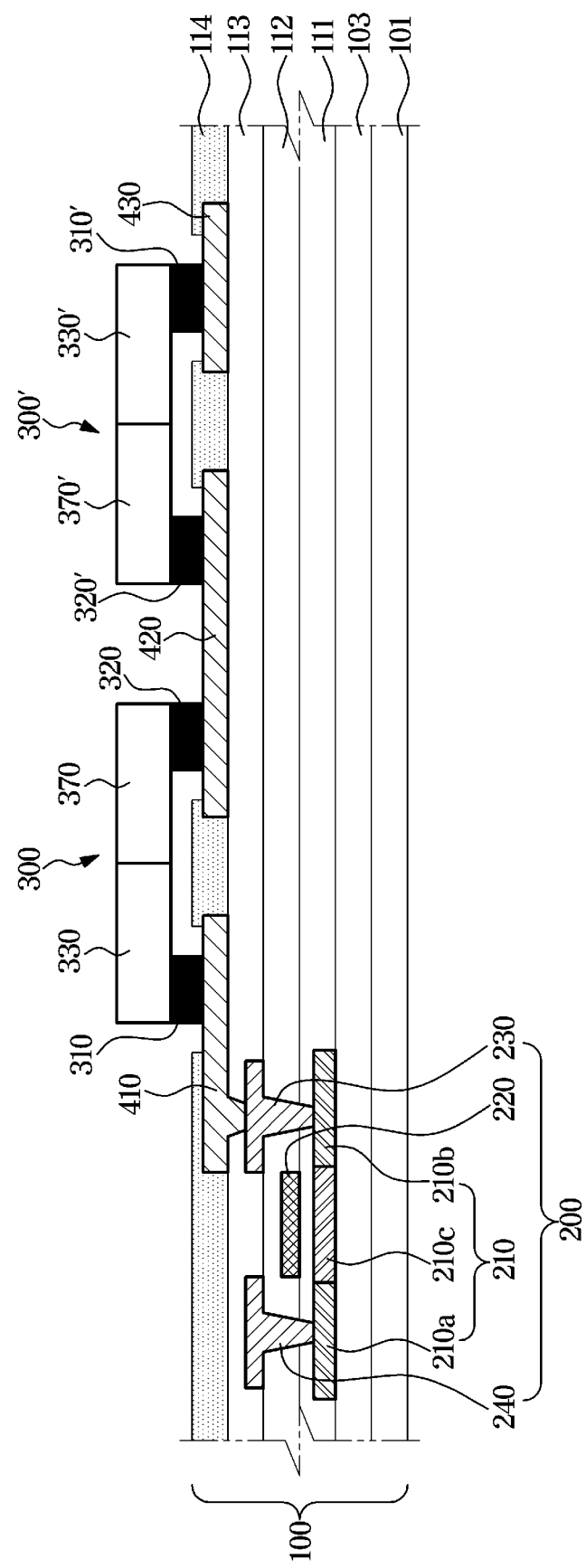
FIG. 11 is a side cross-sectional view illustrating the pad structure for the single repair LED in the display apparatus according to an embodiment.
Figure 12:
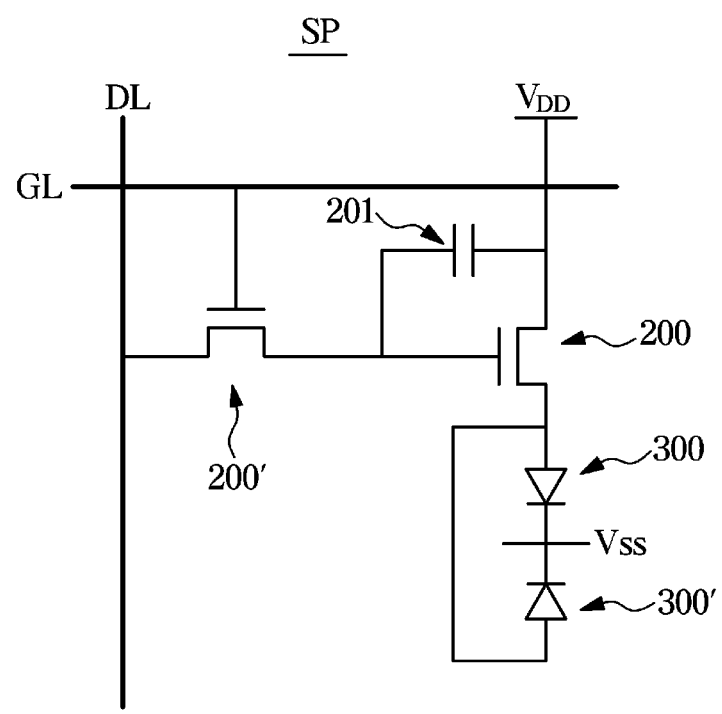
FIG. 12 is a circuit diagram illustrating a sub-pixel circuit to which the repair LED is connected, in the display apparatus according to an embodiment.

FIG. 8 is a view illustrating a pad structure for a single repair LED in the display apparatus according to an embodiment when viewed above, FIGS. 9 to 11 are side-cross-sectional views illustrating the pad structure for the single repair LED in the display apparatus according to an embodiment, and FIG. 12 is a circuit diagram illustrating a sub-pixel circuit to which the repair LED is connected, in the display apparatus according to an embodiment.

In this embodiment, a case, in which a plane of the LED 300 is implemented in a rectangular shape that extends in a first direction and a second direction will be described as an example. For example, the first direction may correspond to a width W of the rectangular shape (i.e., a width direction) and the second direction may correspond to a length L of the rectangular shape (i.e., a length direction). The first and second directions may be parallel to the X-Z plane. The first direction may correspond to either the X-direction or the Z-direction. The second direction may correspond to the other of the X-direction or the Z-direction. The width and the length are parameters perpendicular to each other, and the longer parameter is indicates the length L and the shorter parameter indicates the width W. As illustrated, the anode 310 of the LED 300 is provided at one end of the LED 300 in the length direction, and the cathode 320 of the LED 300 is provided at the other end of the LED 300 in the length direction.

However, embodiments are not limited thereto, and the LED 300 may have a variety of plan shapes, such as a hexagon, an octagon, or an ellipse.

Referring to FIG. 8, a repair anode pad 430 corresponding to the LED 300 may be disposed on an opposite side of the anode pad 410 with respect to the cathode pad 420. That is, the cathode pad 420 may be positioned between the anode pad 410 and the repair anode pad 430. A repair the LED 300' may be placed on and electrically connected to the repair anode pad 430 if the LED 300 is determined to be defective.

FIG. 9 is a side cross-sectional view taken along A-A' line of the structure of the backplane shown in FIG. 8.

Referring to FIG. 9, the repair anode pad 430 may be disposed on the planarization layer 113 and the cathode pad 420 may be interposed between the anode pad 410 and the repair anode pad 430, as described above.

The upper insulating layer 114 may be disposed on the planarization layer 113 on which the anode pad 410, the cathode pad 420, and the repair anode pad 430 are disposed, and the connection holes 114H may be formed through the upper insulating layer 114 to expose the anode pad 410, the cathode pad 420 the repair anode pad 430, respectively.

By using various bonding methods such as a bonding method using the ACF 120 and a bonding method using a soldering, the anode 310 of the LED 300 may be electrically connected to the anode pad 410, and the cathode 320 of the LED 300 may be electrically connected to the cathode pad 420 as illustrated in FIG. 10.

When it is identified that the LED 300 is not defective after testing on the LED 300, the display apparatus 1 may be completed in a state in which the repair LED 300' is not connected. When it is identified that the LED 300 is defective, the repair LED 300' may be electrically connected to the backplane 100 as shown in FIG. 11. The repair LED 300' may have the same structure as the LED 300. Therefore, a description of a detailed structure of the repair LED 300' will be omitted.

In the embodiments described below, the LED 300 will be referred to as the main LED 300 to distinguish it from the repair LED 300'.

An anode 310' of the repair LED 300' may be electrically connected to the repair anode pad 430, and a cathode 320' of the repair LED 300' may be electrically connected to the cathode pad 420. That is, in this example, the repair LED 300' and the main LED 300 may share the cathode pad 420. A circuit structure of the sub-pixel related thereto may be represented as in the circuit of FIG. 12.

Because the main LED 300 and the repair LED 300' share the cathode pad 430, the main LED 300 and the repair LED 300' may be connected to the same reference voltage $V_{SS}$.

In addition, although the repair anode pad 430 for being connected to the repair LED 300' is separately provided, the repair anode pad 430 and the anode pad 410 may receive a driving current from the same driving transistor 200, as shown in FIG. 12.

The defective main LED 300 may be removed, or a line connected to the defective main LED 300 may be cut without removing the defective main LED 300.

Hereinbefore the structure of the single sub-pixel of the display apparatus 1 according to an embodiment has been described. Hereinafter a structure of a single pixel composed of a red sub-pixel, a green sub-pixel, and a blue sub-pixel will be described.

FIGS. 13 to 17 are plan views illustrating a single pixel structure composed of a red sub-pixel, a green sub-pixel, and a blue sub-pixel when viewed above according to various embodiments.

Figure 13:
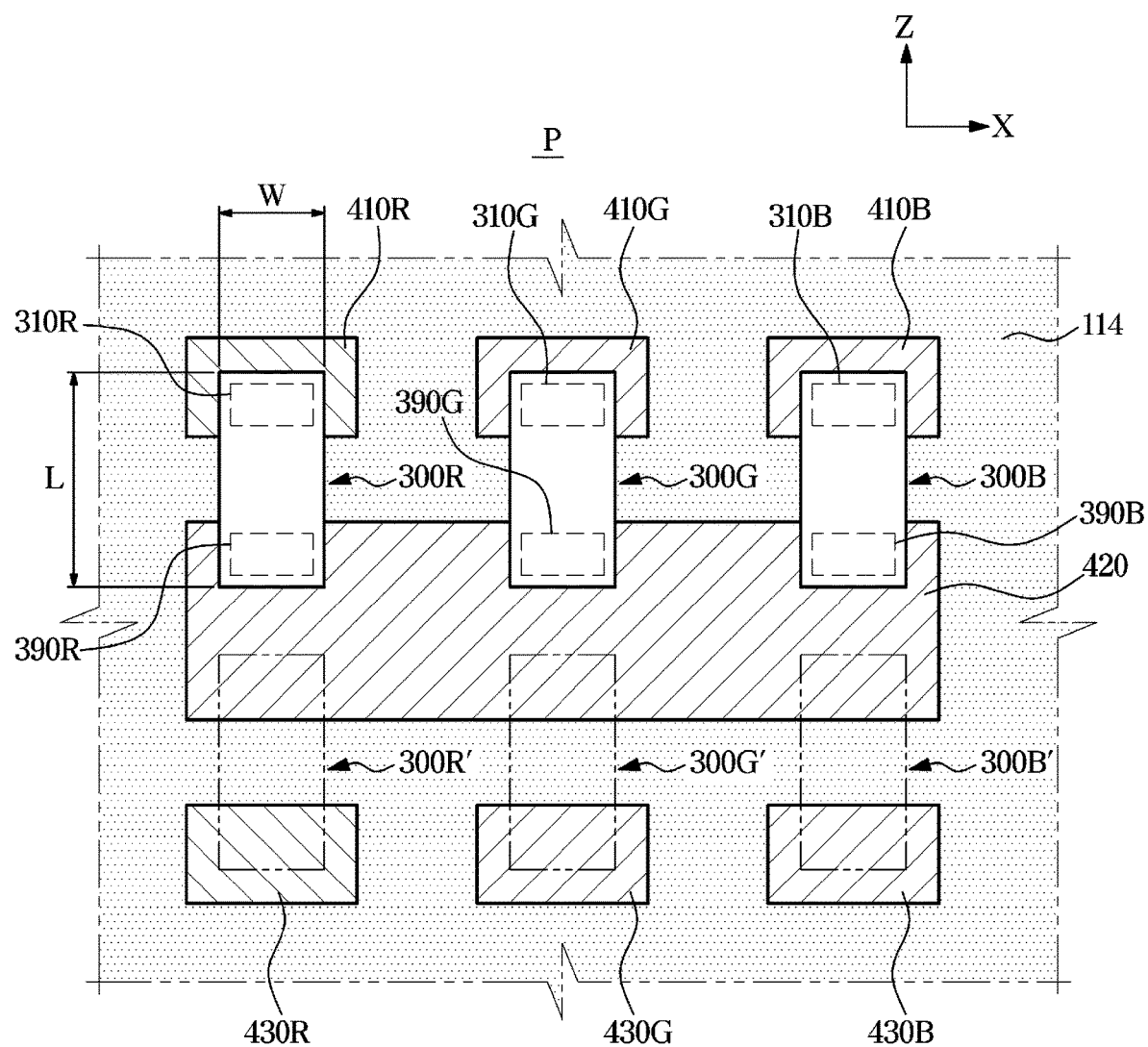
FIG. 13 is a plan view illustrating a single pixel structure composed of a red sub-pixel, a green sub-pixel, and a blue sub-pixel when viewed above.

Referring to FIG. 13, the plurality of LEDs 300R, 300G, and 300B forming a single pixel P may be arranged in the first direction corresponding to the width W of the LED 300. The plurality of LEDs may include a red LED 300R, a green LED 300G, and a blue LED 300B.

A plurality of anode pads 410R, 410G, and 410B electrically connected to anodes 310R, 310G, and 310B of the plurality of LEDs may also be arranged in the first direction of the LED 300.

For example, as illustrated in FIG. 13, the plurality of LEDs 300R, 300G, and 300B share the same cathode pad 420. The plurality of repair anode pads 430R, 430G, and 430B may be disposed on an opposite side of the cathode pad 420, and the plurality of repair anode pads 430R, 430G, and 430B may be arranged in the first direction in the same manner as the plurality of anode pads 410R, 410G, and 410B. In this regard, the cathode pad 420 may be interposed between the plurality of anode pads 410R, 410G and 410B, and the plurality of repair anode pads 430R, 430G and 430B.

That is, according to the example of FIG. 13, the plurality of LEDs 300R, 300G, and 300B may be arranged in the first direction, and the anode pad 410 and the repair anode pad 430 for a single LED may be arranged in a second direction corresponding to the length L of the LED 300. Therefore, the repair LED 300' and the main LED 300 may be aligned along the second direction. For example, the red anode pad 410R and the red repair anode pad 430R are arranged in the second direction. Further, the green anode pad 410G and the green repair anode pad 430G are arranged in the second direction, and the blue anode pad 410B and the blue repair anode pad 430B are arranged in the second direction.

In general, a shape of a single pixel is implemented in an approximately square shape. Therefore, by arranging components in the single pixel to have similar lengths in the first direction and the second direction may lead to a reduced pixel size.

Therefore, as for the display apparatus 1 according to an embodiment, a pad for the repair LED 300' is arranged in along the second direction (length direction), and the plurality of LEDs 300R, 300G, and 300B are arranged along the first direction. Therefore, it is possible to make the arrangement of the component contained in the single pixel as square as possible and minimize the size of the single pixel.

Figure 14:
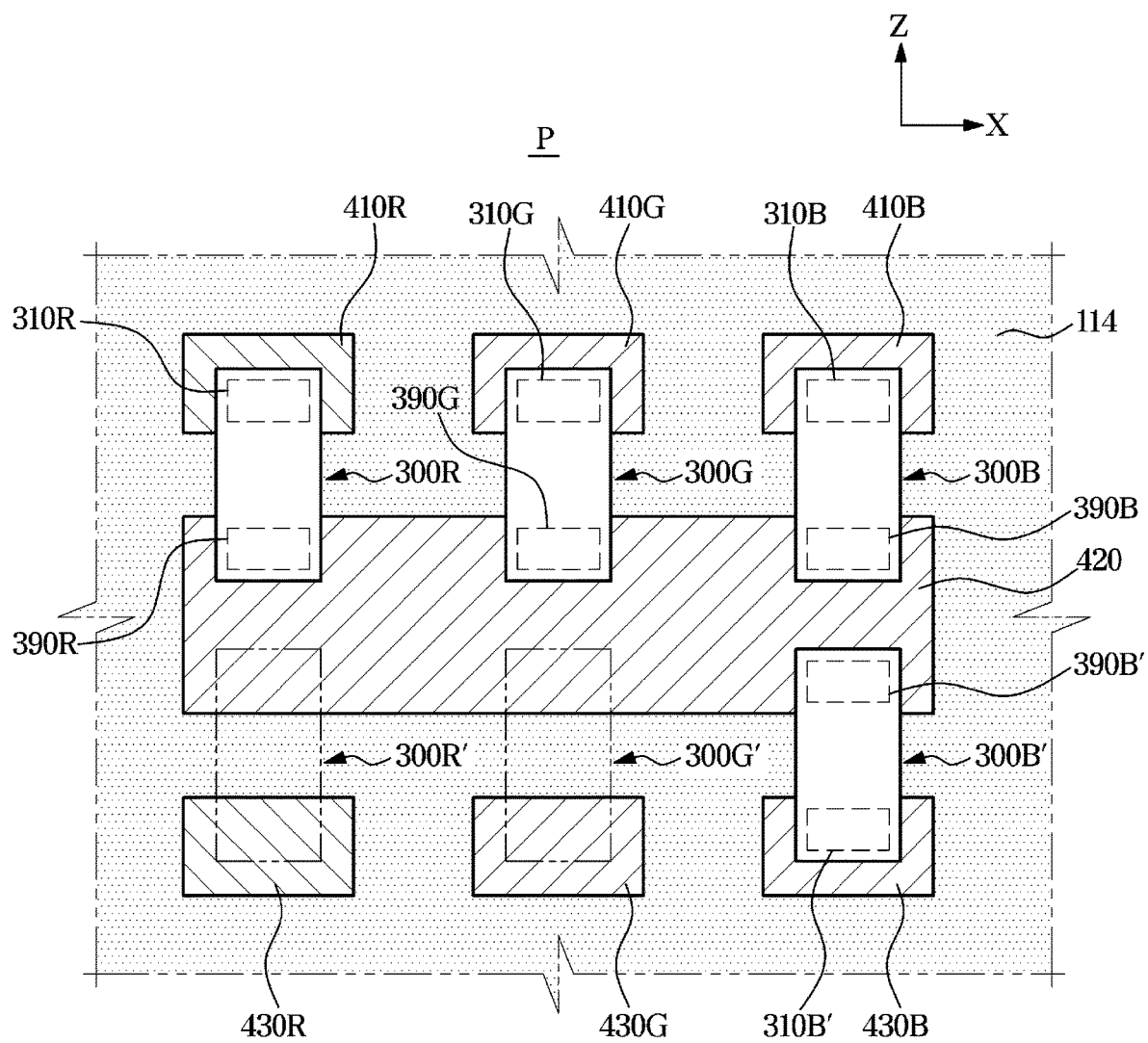
FIG. 14 is a plan view illustrating the single pixel structure composed of the red sub-pixel, the green sub-pixel, and the blue sub-pixel when viewed above.

As mentioned above, after transferring the plurality of LEDs 300R, 300G, and 300B to the backplane 100, a test may be performed to identify whether any of the LEDs is defective. For example, when only the blue LED 300B is defective among the plurality of LEDs, the red repair LED 300R' and the green repair LED 300G' may not be mounted, but only the blue repair LED 300B' may be mounted, as shown in FIG. 14.

Figure 15:
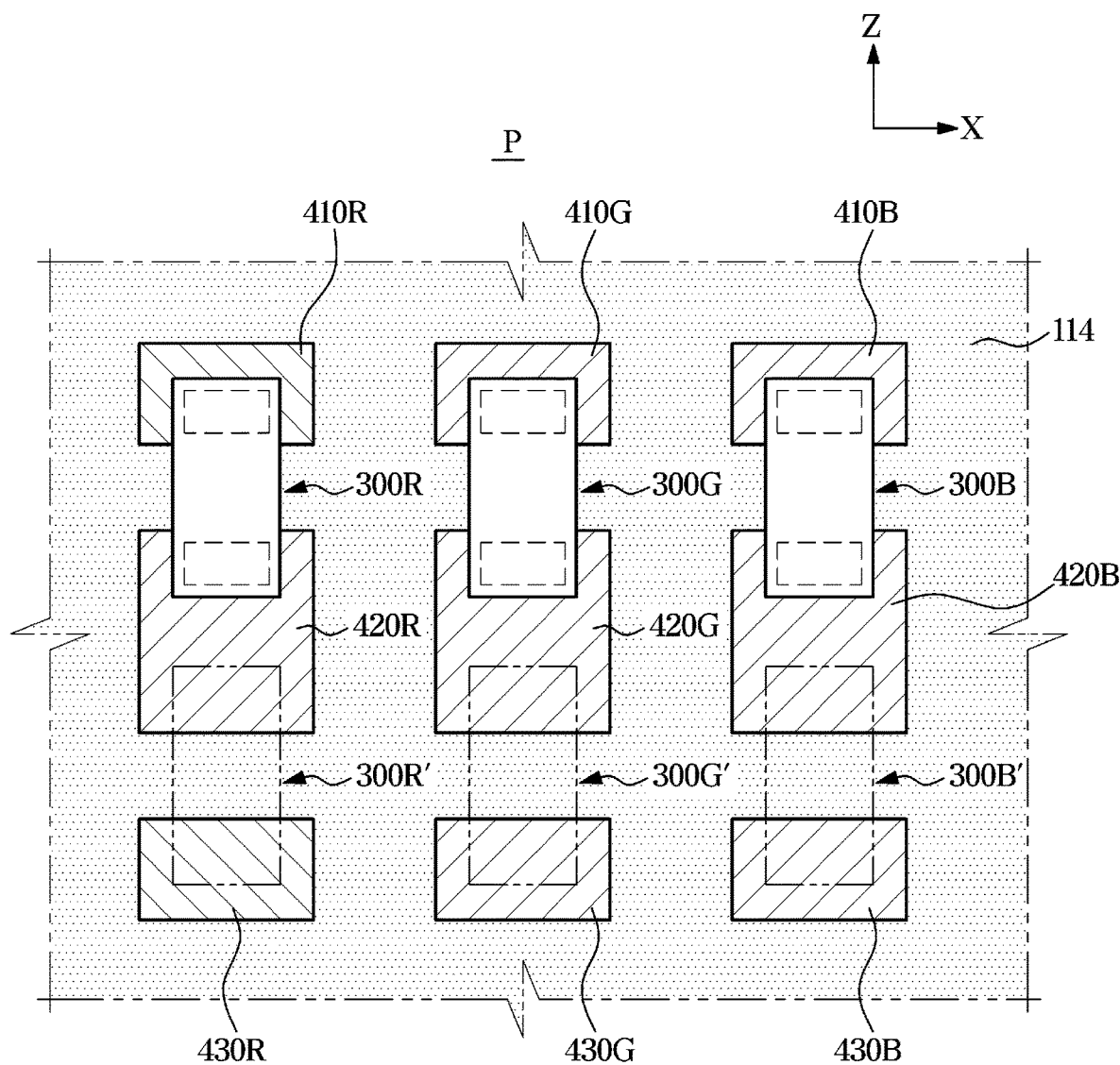
FIG. 15 is a plan view illustrating the single pixel structure composed of the red sub-pixel, the green sub-pixel, and the blue sub-pixel when viewed above.

According to an embodiment, the plurality of LEDs 300R, 300G, and 300B may not be connected to the common cathode pad 420, but may be connected to separate cathode pads 420R, 420G, and 420B, respectively, as illustrated in FIG. 15.

Figure 16:
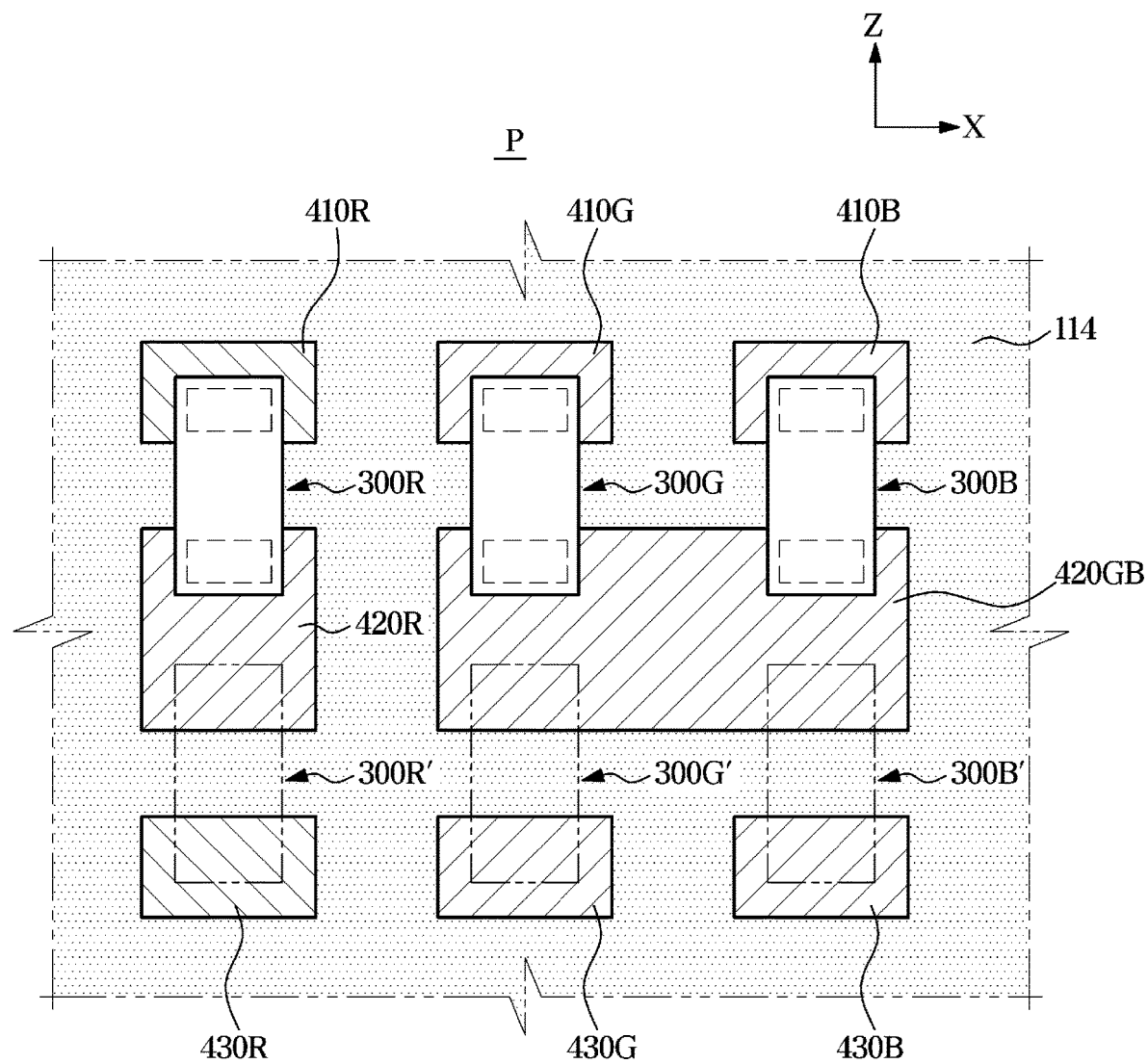
FIG. 16 is a plan view illustrating the single pixel structure composed of the red sub-pixel, the green sub-pixel, and the blue sub-pixel when viewed above.

According to an embodiment, the green LED 300G and the blue LED 300B may be connected to a common cathode pad 420GB (first cathode pad), and the red LED 300R may be connected to a separate cathode pad 420R (second cathode pad), as illustrated in FIG. 16.

Even when the cathode pad 420 is not shared, the plurality of LEDs 300R, 300G, and 300B may be connected to a common reference voltage $V_{ss}$. Alternatively, when the cathode pad 420 is not shared, the plurality of LEDs 300R, 300G, and 300B may be connected to a separate reference voltage $V_{ss}$.

An operating voltage of the LED may be determined by the color emitted by a corresponding LED. In general, an operating voltage of the red LED is the lowest, an operating voltage of the yellow LED and the green LED are slightly higher than the operating voltage of the red LED, and an operating voltage of the blue LED is the highest.

Accordingly, when a separate reference voltage $V_{SS}$ is connected to the red LED 300R, as illustrated in FIGS. 15 and 16, it is possible to lower power consumption by connecting a reference voltage $V_{SS}$, which is higher than a reference voltage $V_{SS}$ connected to the other LEDs 300G and 300B, to the red LED 300R.

Figure 17:
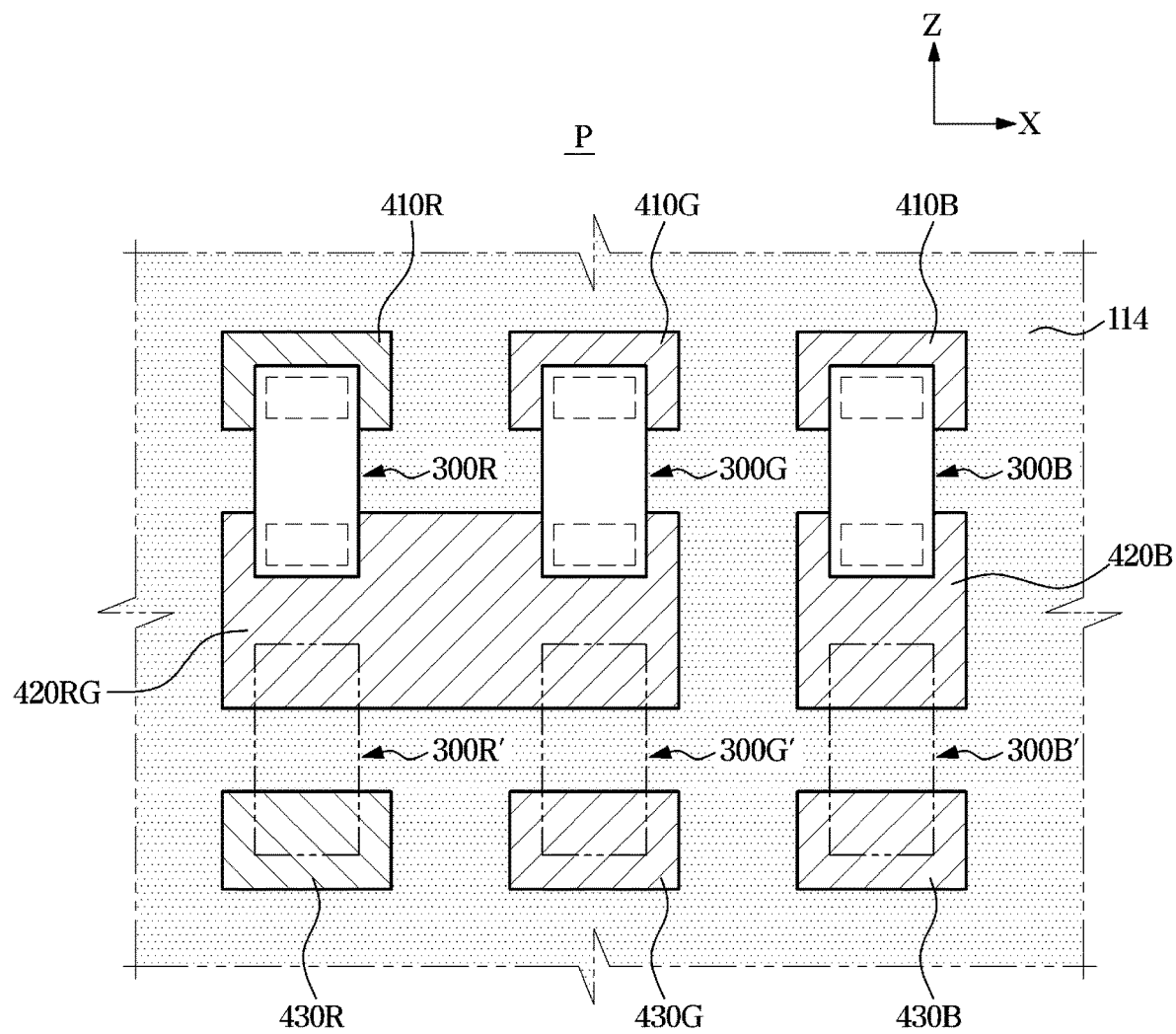
FIG. 17 is a plan view illustrating the single pixel structure composed of the red sub-pixel, the green sub-pixel, and the blue sub-pixel when viewed above.

Alternatively, as illustrated in an example of FIG. 17, the red LED 300R and the green LED 300G may share the cathode pad 420RG (second cathode pad), and the blue LED 300B may be connected to a separate cathode 420B (first cathode pad). In this case, the blue LED 300B may be connected to a separate reference voltage $V_{SS}$, or may be connected to a common reference voltage $V_{SS}$ with the red LED 300R and the green LED 300G.

When the blue LED 300B is connected to separate reference voltages $V_{SS}$, it is possible to lower power consumption by connecting a reference voltage $V_{SS}$, which is lower than a reference voltage $V_{SS}$ connected to the blue LED 300B, to the red LED 300R and the green LED 300G.

Figure 18:
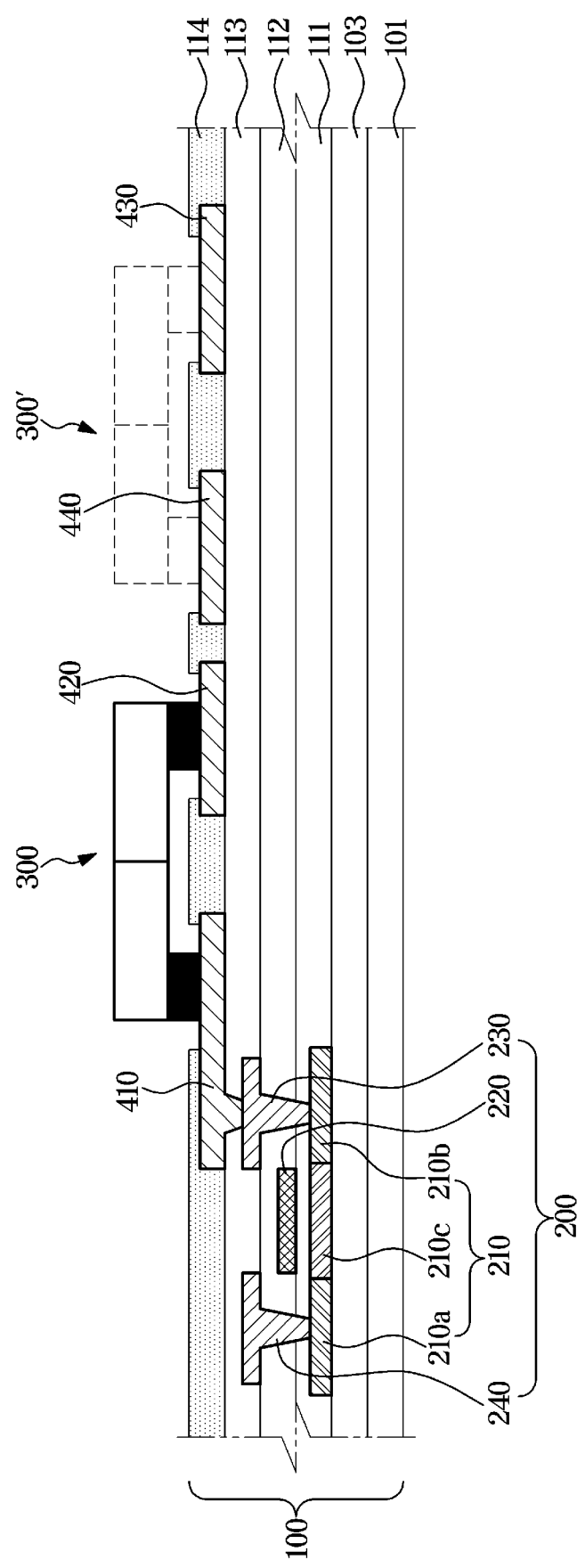
FIG. 18 is a cross-sectional side view illustrating a cathode pad connected to a main LED is separated from a cathode pad for a repair LED in the display apparatus according to an embodiment.
Figure 19:
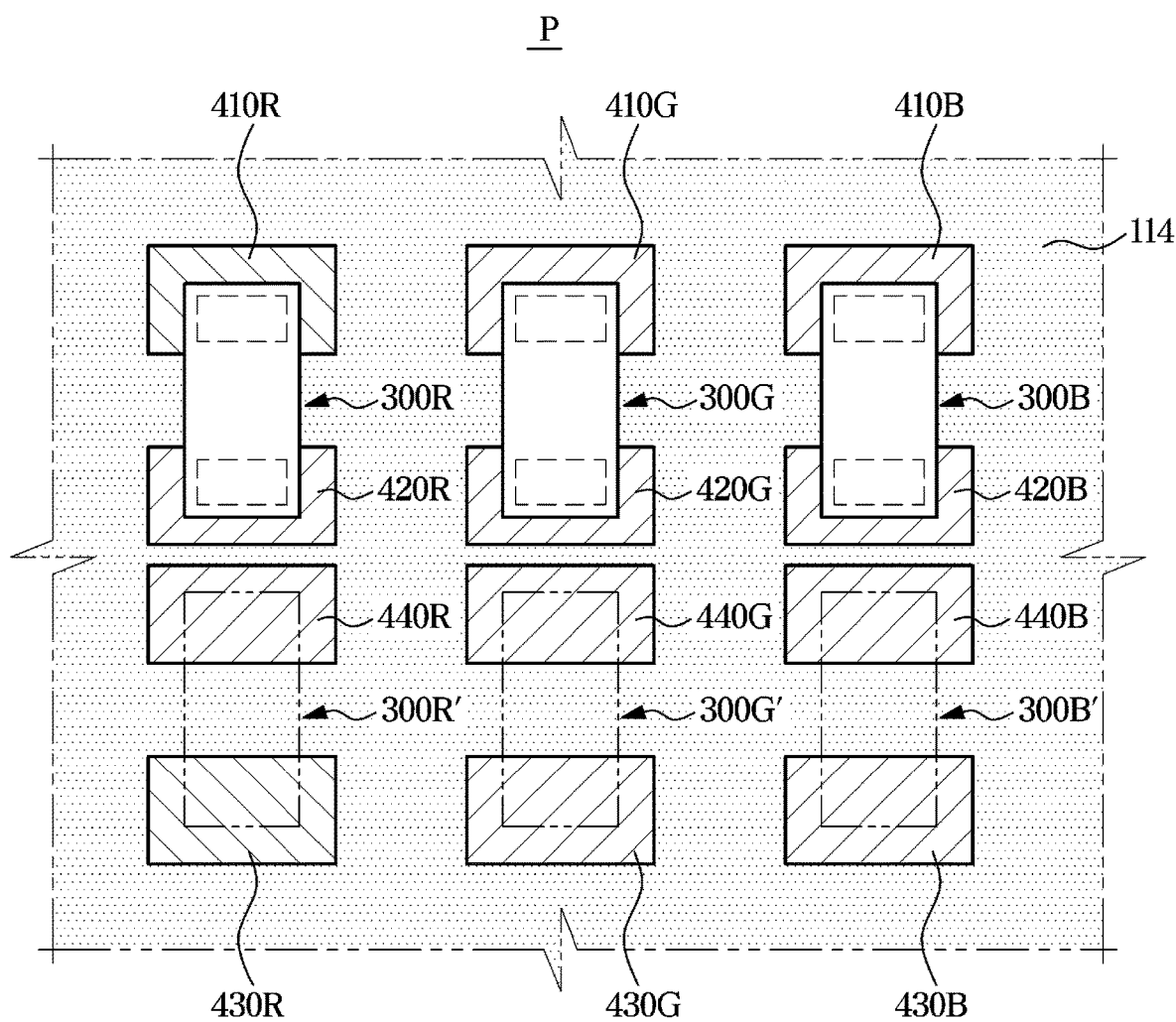
FIG. 19 is a plan view illustrating the structure of FIG. 18 when viewed above.

FIG. 18 is a cross-sectional side view illustrating a cathode pad connected to a main LED 300 is separated from a cathode pad for a repair LED 300' in the display apparatus according to an embodiment, and FIG. 19 is a plan view illustrating the structure of FIG. 18 when viewed above.

Referring to an example of FIG. 18, the cathode pad 420 connected to the main LED 300 may be separate from the repair cathode pad 440 provided for the repair LED 300'. Even in this case, the structure of the single pixel may be provided in such a way that the red LED 300R, the green LED 300G, and the blue LED 300B are disposed in the first direction, and the anode pads 410R, 410G, and 410B and the cathode pads 420R, 420G, and 420B each are connected to opposite ends of the LED in the second direction, and the repair anode pads 430R, 430G, and 430B are disposed on an opposite side of the anode pads 410R, 410G, and 410B with respect to the cathode pads 420R, 420G, and 420B.

As illustrated in FIG. 19, the repair cathode pads 440R, 440G, and 440B may be disposed between the repair anode pads 430R, 430G, and 430B and the cathode pads 420R, 420G, and 420B, but embodiments are not limited thereto and a position of the repair cathode pads 440R, 440G, and 440B may be switched with a position of the repair anode pads 430R, 430G, and 430B.

Figure 20:
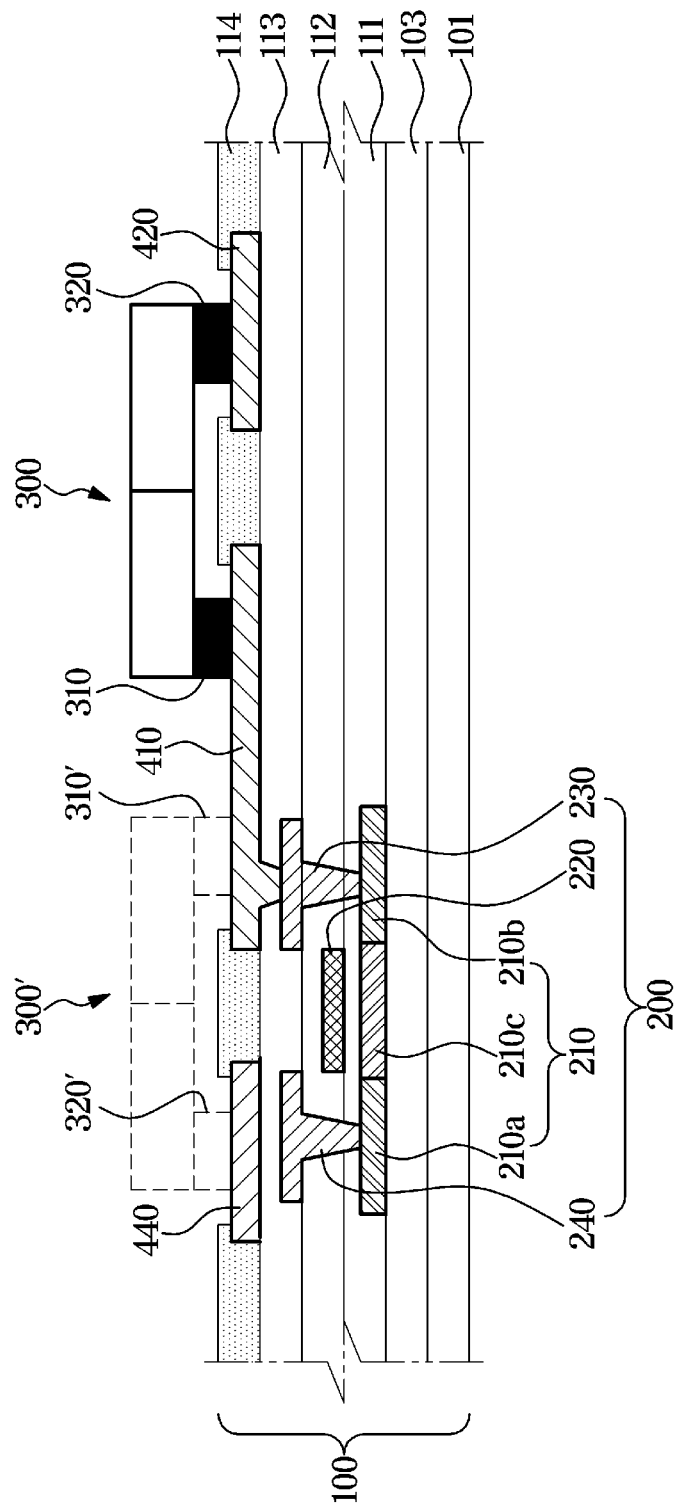
FIG. 20 is a cross-sectional side view illustrating a main LED sharing the anode pad with the repair LED, in the display apparatus according to an embodiment.
Figure 21:
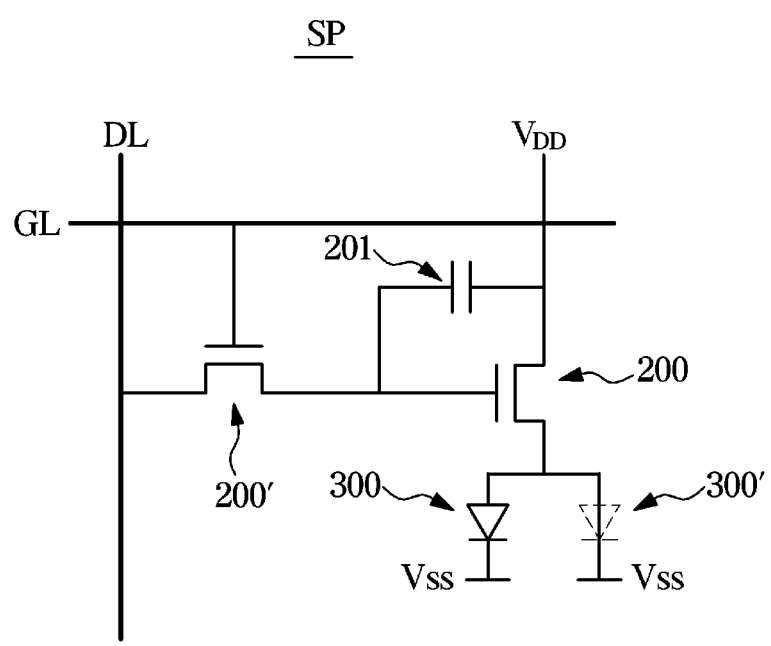
FIG. 21 is a circuit diagram illustrating a sub-pixel structure of FIG. 20.
Figure 22:
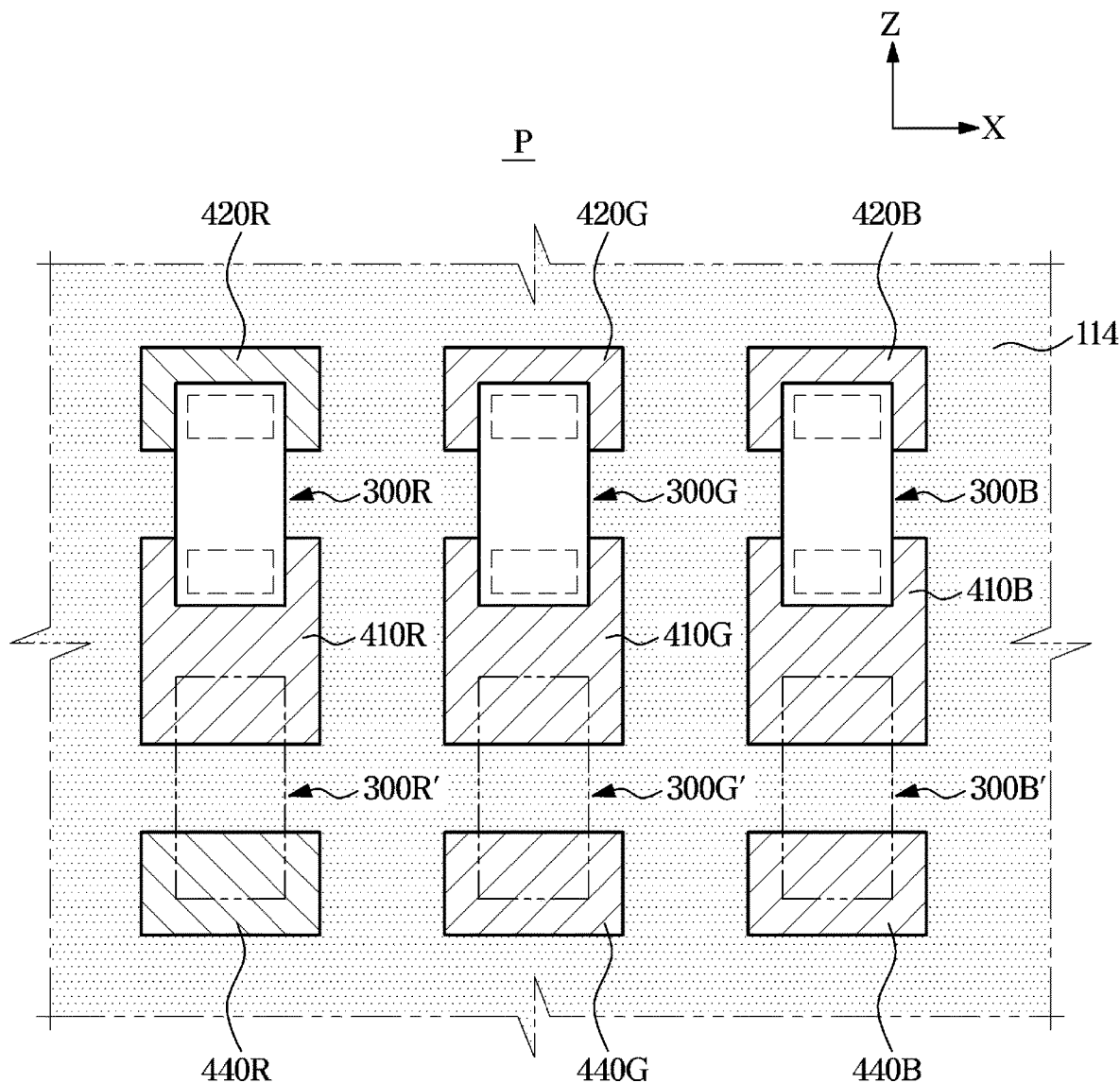
FIG. 22 is a view illustrating the structure of FIG. 20 when viewed above.
Figure 23:
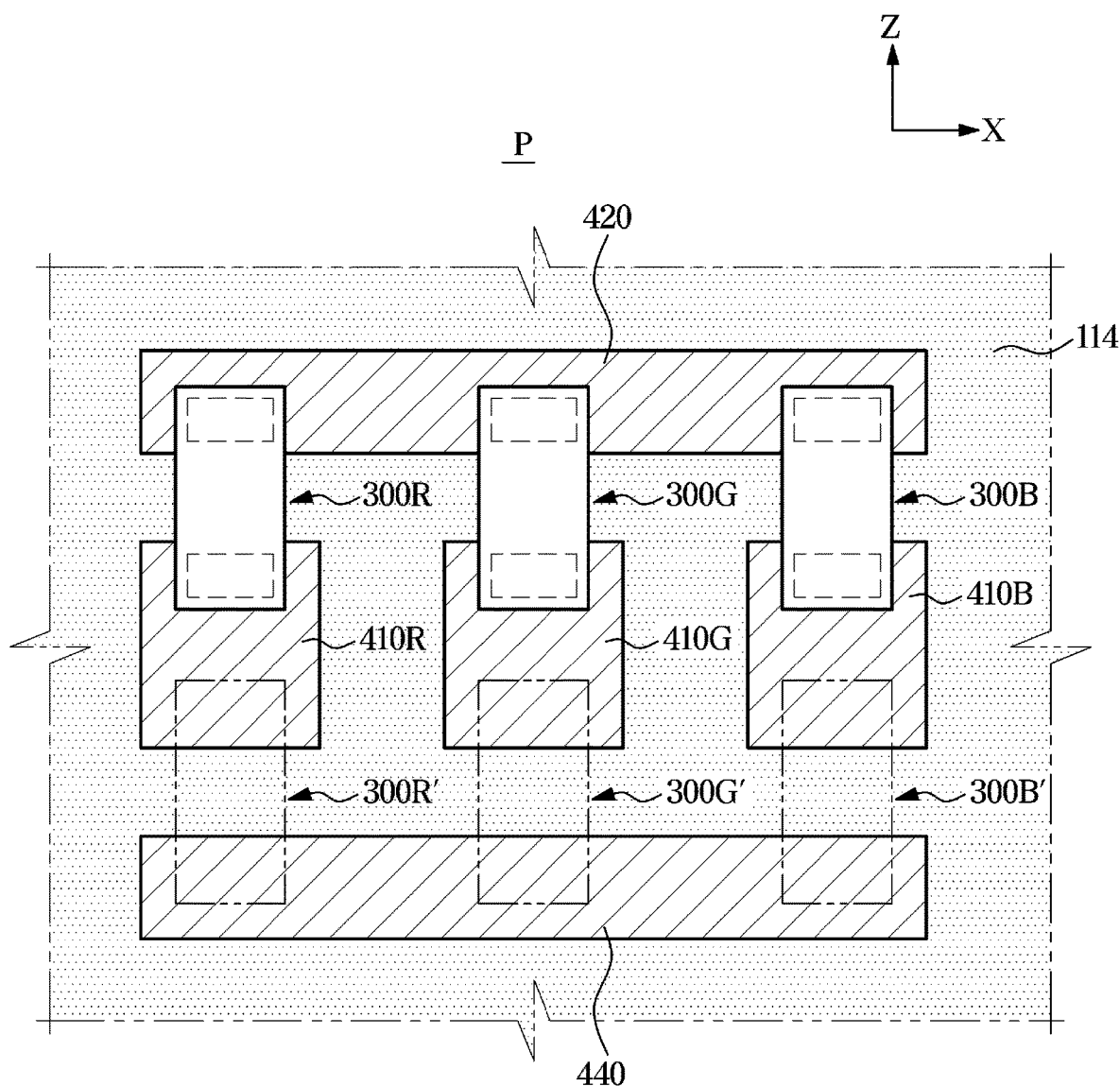
FIG. 23 is a view illustrating the structure of FIG. 20 when viewed above.

FIG. 20 is a cross-sectional side view illustrating a main LED 300 sharing the anode pad for the repair LED 300', in the display apparatus according to an embodiment, FIG. 21 is a circuit diagram illustrating a sub-pixel structure of FIG. 20, and FIGS. 22 and 23 are views illustrating the structure of FIG. 20 when viewed above.

As discussed above, the main LED 300 and the repair LED 300' may share the cathode pad 420. However, embodiments are not limited thereto. As illustrated in FIG. 20, the repair LED 300' may share the anode pad 410 with the main LED 300. In this case, a separate repair cathode pad 440 for being connected to the repair LED 300' may be provided. When the repair LED 300' is mounted due to the occurrence of the defective main LED 300, the anode 310' of the repair LED 300' may be connected to the anode pad 410, and the cathode 320' of the repair LED 300' may be connected to the repair cathode pad 440.

A circuit diagram corresponding to this embodiment is shown in FIG. 21. Although the cathode 320 of the main LED 300 and the cathode 320' of the repair LED 300' are respectively connected to separate cathode pads 420 and 440, the cathode pads 420 and 440 may be connected to the common reference voltage $V_{SS}$ so as to provide the common ground to the main LED 300 and the repair LED 300'.

FIG. 22 illustrates the entire structure of a single pixel P when viewed above, in which the main LED 300 and the repair LED 300' share the anode pad 410. In the same manner as the main LED 300 and the repair LED 300' share the cathode pad 420 which is described above, the plurality of main LEDs 300R, 300G, and 300B may be arranged in the first direction, the anodes 310R, 310G, and 310B provided at one end of the LED in the second direction may be connected to the anode pads 410R, 410G, and 310B, respectively, and the cathodes 320R, 320G, and 320B provided at the other end of the LED may be connected to the cathode pads 420R, 420G, and 420B, respectively.

The repair cathode pads 440R, 440G, and 440B, provided for the cathodes of the repair LEDs 300R', 300G', 300B' may be arranged on the opposite side of the cathode pads 420R, 420G and 420B with respect to the anode pads 410R, 410G, and 410B and arranged in the first direction of the main LED 300. The plurality of anode pads 410R, 410G, and 410B may be disposed between the plurality of cathode pads 420R, 420G, and 420B and the plurality of repair cathode pads 440R, 440G, and 440B.

For example, when a defect occurs in the green LED 300G, the anode 310' of the green repair LED 300G' may be electrically connected to the anode pad 410G, and the cathode 320' of the green repair LED 300G' may be electrically connected to the repair cathode pad 440G, thereby mounting the green repair LED 300G' on the backplane 100. The defective main green LED 300G may be removed, or only the wiring may be cut without removing the defective main green LED 300G.

As shown in FIG. 22, when the red LED 300R, the green LED 300G, and the blue LED 300B are connected to a separate cathode pad 420R, 420G, and 420B, respectively, it is also possible to reduce power consumption by connecting a high reference voltage to only the red LED 300R or by connecting a low reference voltage to only the blue LED 300B, as described above.

Alternatively, the green LED 300G and the blue LED 300B may be connected to a common cathode pad, or the red LED 300R and the green LED 300G may be connected to a common cathode pad.

As illustrated in FIG. 23, the red LED 300R, the green LED 300G, and the blue LED 300B may be commonly connected to a single cathode pad 420. Alternatively, a common cathode pad 440 may be provided for the red repair LED 300R', the green repair LED 300G', and the blue repair LED 300B'.

FIGS. 20 to 23 illustrates embodiments in which the reference voltage $V_{SS}$ is directly connected to the LED 300 and the power voltage $V_{DD}$ is applied through the driving transistor 200 by employing the PMOS type as the driving transistor 200. However, embodiments are not limited thereto. Hereinafter a case in which an NMOS type is employed as the driving transistor 200 will be described.

Figure 24:
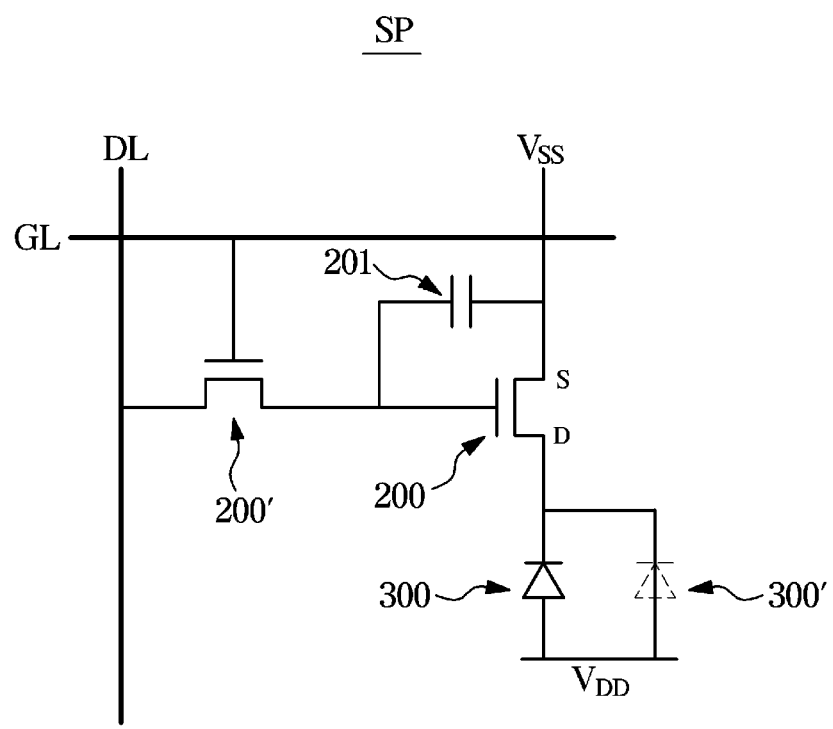
FIG. 24 is a circuit diagram illustrating a sub-pixel circuit in which an NMOS-type transistor is used as a driving transistor and a power voltage $V_{DD}$ is directly applied to the LED, in the display apparatus according to an embodiment.
Figure 25:
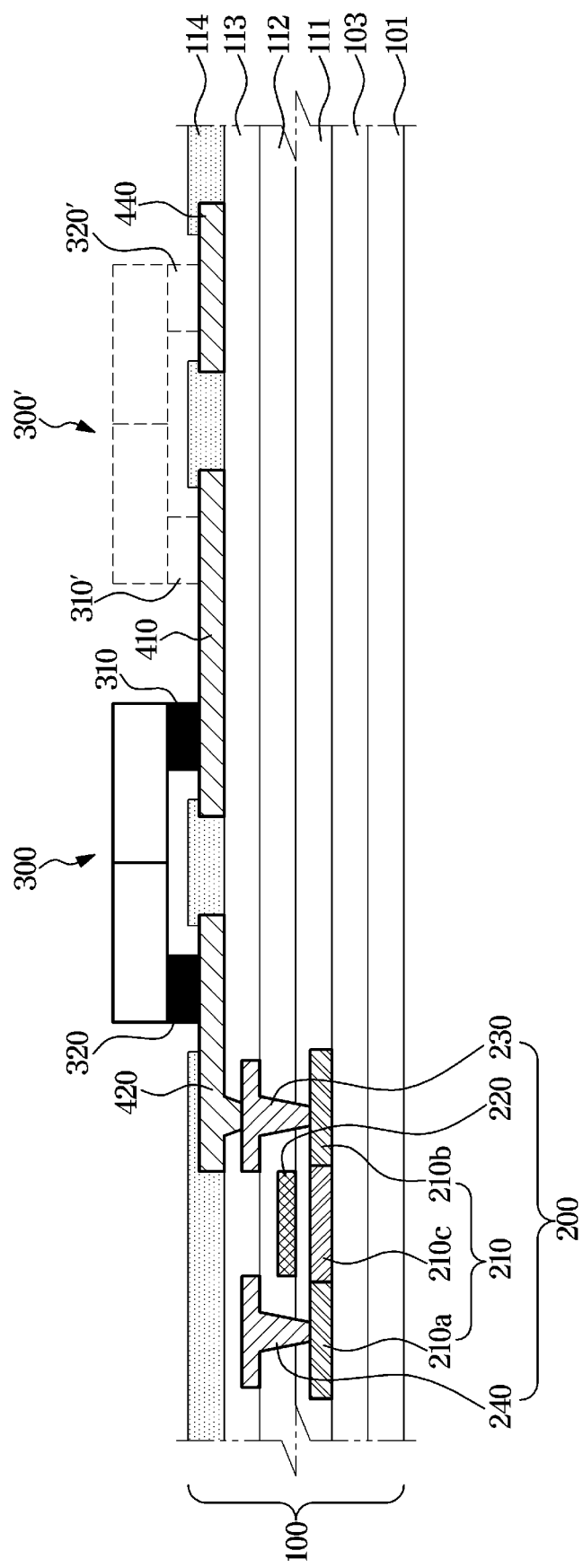
FIG. 25 is a side cross-sectional view when a circuit structure of FIG. 24 is applied.

FIG. 24 is a circuit diagram illustrating a sub-pixel circuit in which an NMOS-type transistor is used as a driving transistor and a power voltage $V_{DD}$ is directly applied to the LED, in the display apparatus according to an embodiment, and FIG. 25 is a side cross-sectional view when a circuit structure of FIG. 24 is applied.

In the PMOS type transistor used as the driving transistor 200 in the above-mentioned examples, a current flows from the source electrode to the drain electrode. On the other hand, in the NMOS type transistor, a current flows from the drain electrode to the source electrode. Therefore, when the NMOS type is used as the driving transistor 200 of the sub-pixel circuit, the cathode 320 of the LED 300 may be connected to the drain electrode 230 of the driving transistor 200 and the reference voltage $V_{SS}$ may be connected to the source electrode 240 of the driving transistor 200 as shown in FIGS. 24 and 25. The power voltage $V_{DD}$ may be directly applied to the anode 310 of the LED 300. For this, the power line VL, to which the power voltage $V_{DD}$ is applied, may be connected to the anode pad 410 connected to the anode 310 of the LED 300.

It is possible to lower power consumption by applying a power voltage which is lower than a power voltage applied to the green LED 300G or the blue LED 300B, to the red LED 300R because the power voltage is directly applied to the anode 310 of the LED 300.

When the repair LED 300' is mounted due to the occurrence of the defective main LED 300, the anode 310' of the repair LED 300' may be electrically connected to the anode pad 410, to which the anode 310 of the main LED 300 is connected, and the cathode 320' of the repair LED 300' may be electrically connected to a separate repair cathode pad 440, as described above with reference to FIGS. 20 to 23. Although the repair cathode pad 440 is physically separated from the cathode pad 420, two cathode pads 440 and 420 may be electrically connected to the same drain electrode 230 of the driving transistor 200 through the wiring. A positional relationship between the anode pad 410, the cathode pad 420, the repair cathode pad 440, and the LED 300 is as described above with reference to FIGS. 22 and 23.

Hereinafter a manufacturing method of the display apparatus according to an embodiment will be described. For example, the display apparatuses discussed above with reference to FIGS. 1 through 25 may be manufactured by the manufacturing method discussed below. Accordingly, an embodiment of the manufacturing method of the display apparatus will be described with reference to the drawings described above.

Figure 26:
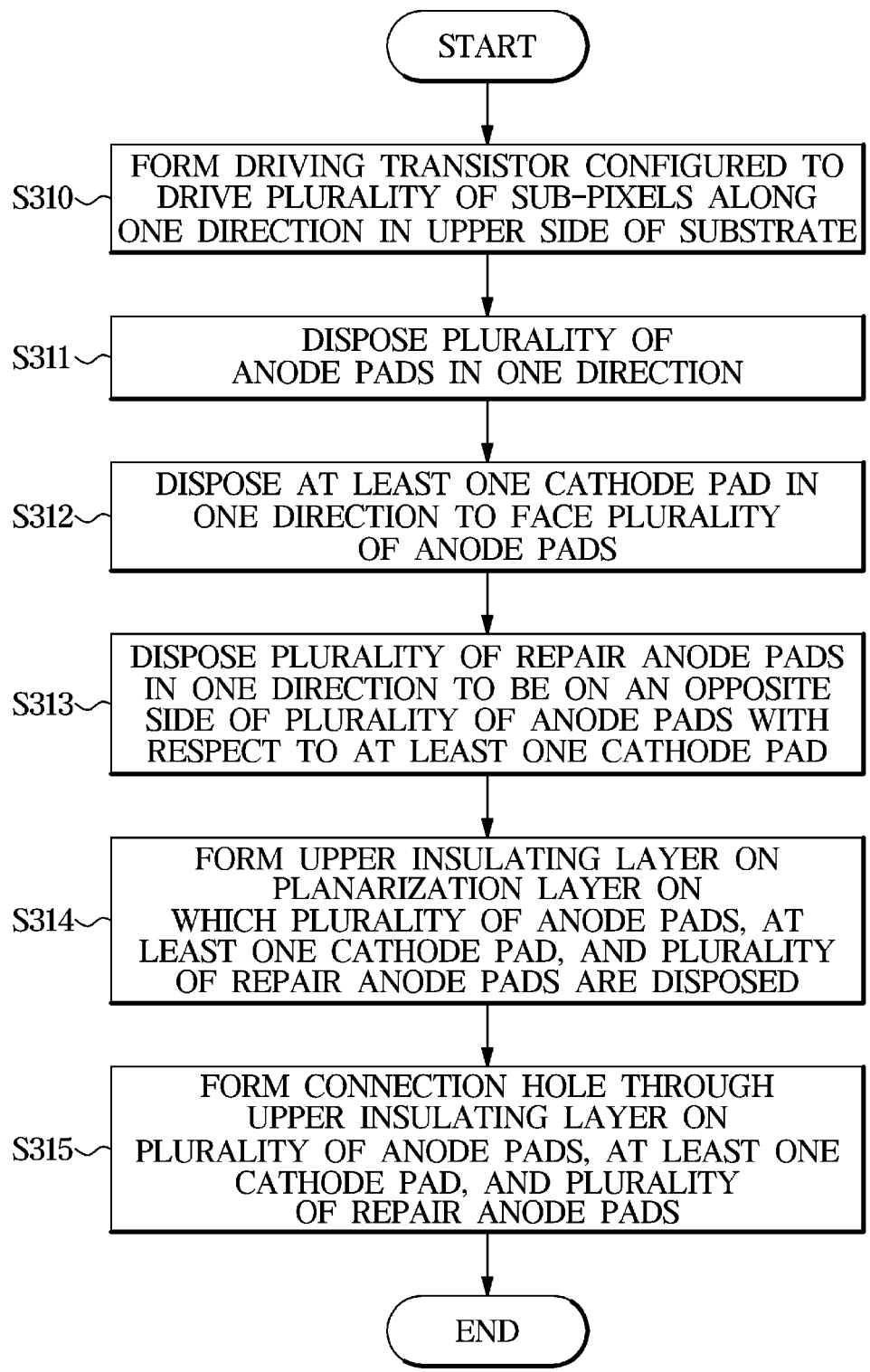
FIG. 26 is a flowchart illustrating a method for manufacturing a backplane in a manufacturing method of the display apparatus according to an embodiment.

FIG. 26 is a flowchart illustrating a method for manufacturing a backplane in a manufacturing method of the display apparatus according to an embodiment.

Referring to FIG. 26, the plurality of driving transistors 200 configured to drive each of the plurality of sub-pixels is formed in one direction (S310) on an upper side of the substrate 101.

Referring to again FIGS. 3 and 4, the sub-pixel driving circuit includes the driving transistor 200 configured to drive the LED 300. In addition, various wirings for applying the data voltage VDATA, the power voltage $V_{DD}$, the reference voltage $V_{SS}$ to the LED 300, the switching transistor 200', the capacitor 201 may be contained in the sub-pixel driving circuit. However, in this embodiment, only the driving transistor 200 will be described.

Forming the plurality of the driving transistor 200 in the upper side of the substrate 101 may include forming the buffer layer 103 on the substrate 101, disposing the active layer 210 on the buffer layer 103, forming the gate insulating layer 111 on the buffer layer 103, on which the active layer 210 is disposed, and disposing the gate electrode 220 on the gate insulating layer 111. Further, the formation of the plurality of the driving transistor 200 in the upper side of the substrate 101 may include forming the interlayer insulating layer 112 on the gate insulating layer 111 on which the gate electrode 220 is disposed, and forming the hole on the interlayer insulating layer 112 and the gate insulating layer 111. In addition, the formation of the plurality of the driving transistor 200 in the upper side of the substrate 101 may include disposing the source electrode 240 and the drain electrode 230 on the interlayer insulating layer 112, and electrically connecting the source electrode 240 and the drain electrode 230 to the active layer 210 through the hole formed on the interlayer insulating layer 112 and the gate insulating layer 111. Further, the formation of the plurality of the driving transistor 200 in the upper side of the substrate 101 may include forming the planarization layer 113 on the interlayer insulating layer 112 on which the source electrode 240 and the drain electrode 230 are disposed.

The plurality of anode pads 410R, 410G, and 410B, at least one cathode pad 420 and the plurality of repair anode pads 430R, 430G, and 430B are disposed on the planarization layer 113. It will be described in detail below.

In operation S311, plurality of anode pads may be arranged in one direction, and in operation S312, at least one cathode pad may be arranged in one direction to face the plurality of anode pads. In addition, in operation S313 the plurality of repair anode pads may be disposed in one direction to be on an opposite side of the plurality of anode pads with respect to at least one cathode pad. "One direction" may correspond to the width direction of the LED 300, and the width direction may be perpendicular to the length direction of the LED 300. With reference to FIG. 1, the width direction of the LED 300 may correspond to the X-direction or the Z-direction.

An order, in which the plurality of anode pads, the at least one cathode pad, and the plurality of repair anode pads are disposed is not limited to the order in the flowchart, and thus the plurality of anode pads, the at least one cathode pad, and the plurality of repair anode pads may be disposed simultaneously or in a different order from the order in the flowchart.

In operation S314, upper insulating layer is formed on the planarization layer on which the plurality of anode pads, the at least one cathode pad, and the plurality of repair anode pads are disposed.

In operation S315, the connection hole configured to expose the plurality of anode pads, the at least one cathode pad, and the plurality of repair anode pads is formed on the upper insulating layer on the plurality of anode pads, the at least one cathode pad, and the plurality of repair anode pads.

The backplane 100 as shown in FIG. 4 may be manufactured according to the above-described process. However, embodiments are not limited thereto and other processes may be added in addition to the above-described process to manufacture the backplane 100, and further the backplane 100 may further include other layers or other components in addition to the structure illustrated in FIG. 4.

In addition, as illustrated in FIG. 13, the common cathode pad 420 may be provided for the plurality of LEDs 300R, 300G, and 300B, and as shown in FIG. 15, the plurality of LEDs 300R, 300G, and 300B may be provided with separate cathode pads 420R, 420G, and 420B, respectively. As illustrated in FIGS. 16 and 17, the common cathode pads 420GB and 420RG may be provided for some LEDs and separate cathode pads 420R and 420B may be provided for the other LEDs.

Figure 27:
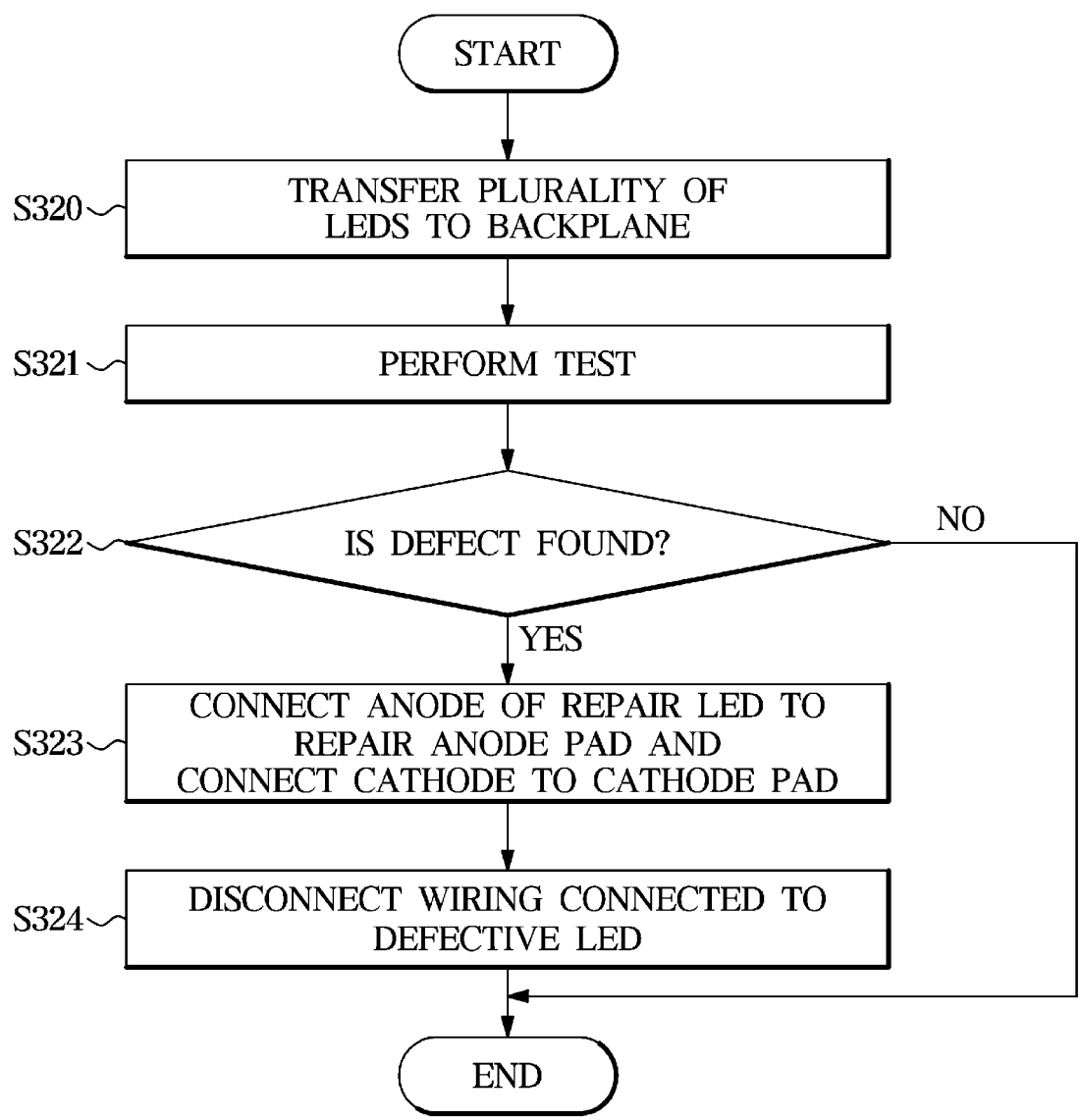
FIG. 27 is a flowchart illustrating a method for transferring the LED to the backplane and testing the LED in a manufacturing method of the display apparatus according to an embodiment.

FIG. 27 is a flowchart illustrating a method for transferring the LED to the backplane and testing the LED in a manufacturing method of the display apparatus according to an embodiment.

Referring to FIG. 27, in operation S320 the plurality of LEDs is transferred to the backplane 100 manufactured according to the described above process of FIG. 26. For example, the plurality of LEDs 300R, 300G, and 300B may be picked up from a wafer and transferred to the backplane 100. In this regard, the plurality of LEDs 300R, 300G, and 300B may be mounted on the backplane 100 at the same time. Transferring or mounting the LED 300 to the backplane 100 may include electrically connecting the anode 310 disposed on one end of the LED 300 to the anode pad 410, and electrically connecting the cathode 320 disposed on the other end of the LED 300 to the cathode pad 420. The anode 310 and the cathode 320 may be arranged along the second direction (the length direction) of the LED 300.

As described above, the ACF 120 as shown in FIG. 5 may be used to connect the LED 300 to the backplane 100. In this case, the ACF 120 is formed on the upper insulating layer 114 of the backplane 100. Heat is applied to the ACF 120, the anode 310 of the LED 300 is positioned to face the anode pad 410 exposed through the connection hole 114H, and the LED 300 is pressed against the ACF 120 while the cathode 320 of the LED 300 is positioned to face the cathode pad 420 exposed through the connection hole 114H.

Because the ACF 120, to which the heat and the pressure are applied, allows a current to flow in a direction in which the pressure is applied, the anode 310 and the cathode 320 of the LED 300 may be electrically connected to the anode pad 410 and the cathode pad 420 of the backplane, respectively.

However, embodiments are not limited thereto, and according to another embodiment the manufacturing method of the display apparatus does not require the use of an anisotropic conductive film. Therefore, the LED 300 may be electrically connected to the backplane 100 through other bonding methods such as a soldering method using a metal ink. Particularly, when using other bonding method, a bank and a passivation layer for surrounding the LED 300 may be formed so as to fill an air gap formed around the anode pad 410 and the cathode pad 420. For example, the passivation layer may be formed of a material such as acrylic, poly methyl methacrylate (PMMA), benzocyclobutene (BCB), polyimide, acrylate, epoxy, and polyester.

The bank is formed of a material that absorbs light, a material that reflects light, or a material that scatters light, and thus the bank may absorb or block light incident from the outside, thereby improving a bright room contrast of the display apparatus 1. For example, the bank may be formed of an organic insulating material, an inorganic insulating material, or an opaque material such as a black matrix material, or alternatively, the bank may be a distributed Bragg reflector (DBR) having high reflectivity or a mirror reflector formed of a metal.

When the manufacturing method of the display apparatus includes bonding the LED 300 and the backplane 100 using the ACF 120, the LED 300 is pressed into the ACF 120 while being buried in the ACF 120. Therefore, the air gap may be not formed around the anode pad 410 and the cathode pad 420, and thus the structure such as the bank and the passivation layer may be not required. However, it is also possible to improve the bright room contrast of the display apparatus 1 by including the bank formed of a material that absorbs light, a material that reflects light, or a material that scatters light. Therefore, according to an embodiment a display apparatus may include a bank formed of a material that absorbs light, a material that reflects light, or a material that scatters light and ACF 120.

After the plurality of LEDs is transferred to the backplane, in operation S321, a test to identify whether any of the plurality of LEDs is defective may be performed. Various methods may be employed to perform the test. For example, a method of photographing the plurality of LEDs with a camera to identify whether the plurality of LEDs normally emit light may be employed.

In operation S322 it is determined whether a defective LED is found based on a result of the test. When a defective LED is found (yes in S322), the repair LED 300' corresponding to the defective LED is mounted on the backplane 100 in operation S323. Particularly, the anode 310' of the repair LED 300' may be connected to the repair anode pad 430, and the cathode 320' of the repair LED 300' may be connected to the cathode pad 420. When the LED 300 and the backplane 100 are bonded using the ACF 120, a portion of the ACF 120 at positions corresponding to the repair anode pad 430 and the cathode pad 420 may be cut out, for example a hole may be formed in the ACF 120, to expose the repair anode pad 430 and the cathode pad 420. The repair LED 300' may be connected to the backplane 100 by using the soldering method using a metal ink or the ACF 120 again.

In operation S324, a wiring connected to the defective LED may be disconnected. Because the repair LED 300' is connected to the cathode pad 420, the wiring connected to the anode pad 410 may be disconnected (for example, the wiring may be cut), or the electrical connection between the anode pad 410 and the LED 300 may be disconnected (for example, the wiring may be cut). Alternatively, the defective LED 300 may be removed.

Figure 28:
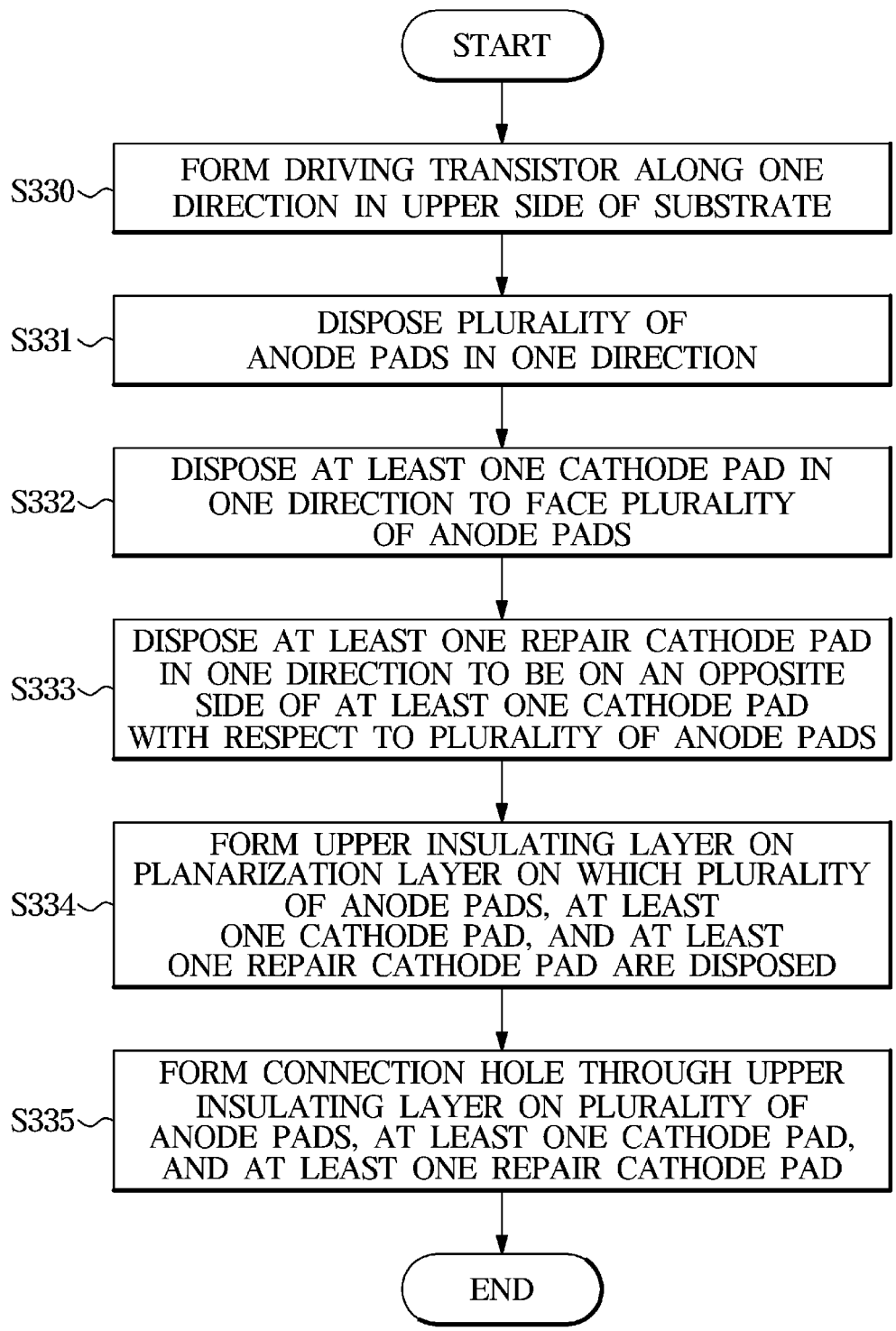
FIG. 28 is a flowchart illustrating another method for manufacturing a backplane in a manufacturing method of the display apparatus according to an embodiment.

FIG. 28 is a flowchart illustrating a method for manufacturing a backplane in a manufacturing method of the display apparatus according to an embodiment.

Referring to FIG. 28, the plurality of driving transistors 200 configured to drive each of the plurality of sub-pixels is formed in one direction (S330) on an upper side of the substrate 101. The description of the process of forming the plurality of driving transistors is as described above with reference to FIG. 26.

In operation S331, the plurality of anode pads may be arranged in one direction, and in operation S332 at least one cathode pad may be arranged in one direction to face the plurality of anode pads. In operation S333 at least one repair cathode pad may be disposed in one direction to be on an opposite side of the at least one cathode pad with respect to the plurality of anode pads. "One direction" may correspond to the width direction of the LED 300, and the width direction may be perpendicular to the length direction of the LED 300. With reference to FIG. 1, the width direction of the LED 300 may correspond to the X-direction or the Z-direction.

An order, in which the plurality of anode pads, the at least one cathode pad, and the at least one repair cathode pad are disposed, is not limited to the order in the flowchart, and thus the plurality of anode pads, the at least one cathode pad, and the at least one repair cathode pad may be disposed simultaneously or in a different order from the order in the flowchart.

In operation S334 the upper insulating layer is formed on the planarization layer on which the plurality of anode pads, the at least one cathode pad, and at least one repair cathode pad are disposed.

In operation S335 the connection hole configured to expose the plurality of anode pads, the at least one cathode pad, and the at least repair cathode pad is formed on the upper insulating layer on the plurality of anode pads, the at least one cathode pad, and the at least one repair cathode pad.

The backplane 100 as shown in FIG. 22 may be manufactured according to the above-described process. However, embodiments are not limited thereto and other processes may be added in addition to the above-described process to manufacture the backplane 100, and further the backplane 100 may further include other layers or other components in addition to the structure illustrated in FIG. 22.

The repair cathode pads 440R, 440G, and 440B provided to be connected to the cathodes of the repair LEDs 300R', 300G', and 300B' may be arranged on an opposite side of the cathode pads 420R, 420G and 420B with respect to the anode pads 410R, 410G, and 410B, and further the repair cathode pads 440R, 440G, and 440B may be arranged in the first direction of the main LED 300. The plurality of anode pads 410R, 410G, and 410B is disposed between the plurality of cathode pads 420R, 420G, and 420B and the plurality of repair cathode pads 440R, 440G, and 440B.

In addition, the green LED 300G and the blue LED 300B may be connected to a common cathode pad, or the red LED 300R and the green LED 300G may be connected to a common cathode pad.

Alternatively, as illustrated in FIG. 23, the red LED 300R, the green LED 300G, and the blue LED 300B may be commonly connected to a single cathode pad 420. In addition, a common cathode pad 440 may be provided for the repair LED 300'.

The driving transistor 200 formed in the upper side of the substrate 101 according to the above-described embodiment of FIG. 26 is the PMOS type transistor in which a current flows from the source electrode 240 to the drain electrode 230. According to the embodiment of FIG. 28, the driving transistor 200 formed in the upper side of the substrate 101 may be the PMOS type or the NMOS type in which a current flows from the drain electrode 230 to the source electrode 240. When the driving transistor 200 is implemented as the NMOS type, the power voltage $V_{DD}$ may be directly applied to the LED as shown in FIG. 24. For this, the power line VL, to which the power voltage $V_{DD}$ is applied, may be connected to the anode pad 410 that is connected to the anode 310 of the LED 300.

Further, the cathode pad 420 may be connected to the drain electrode 230 of the driving transistor 200, and the reference voltage $V_{SS}$ may be connected to the source electrode 240 of the driving transistor 200.

FIG. 29 is a flowchart illustrating another method for transferring the LED to the backplane and testing the LED in a manufacturing method of the display apparatus according to an embodiment.

Referring to FIG. 29, in operation S340 the plurality of LEDs is transferred to the backplane 100 manufactured according to the described above process of FIG. 28. Transferring the LED 300 to the backplane 100 may include electrically connecting the anode 310 provided at one end of the LED 300 to the anode pad 410, and electrically connecting the cathode 320 provided at the other end of the LED 300 to the cathode pad 420. When the driving transistor 200 of the backplane 100 is the PMOS type, the drain electrode 230 of the driving transistor 200 is electrically connected to the anode pad 410 and the reference voltage $V_{SS}$ is connected to the cathode pad 420. When the driving transistor 200 of the backplane 100 is the NMOS type, the power voltage $V_{DD}$ is applied to the anode pad 410, and the drain electrode 230 is connected to the cathode pad 420.

After the plurality of LEDs is transferred to the backplane, a test configured identify whether the LED is defective may be performed in operation S341.

In operation S342, it is determined whether a defective LED is found based on a result of the test. When a defective LED is found (yes in S342), the repair LED 300' corresponding to the defective LED is mounted on the backplane 100 in operation S343. Particularly, the anode 310' of the repair LED 300' may be connected to the anode pad 410, and the cathode 320' of the repair LED 300' may be connected to the repair cathode pad 440. When the LED 300 and the backplane 100 are bonded using the ACF 120, a portion of the ACF 120 at positions corresponding to the repair cathode pad 440 and the anode pad 410 may be cut out, for example a hole may be formed in the ACF 120, to expose the repair cathode pad 440 and the anode pad 410. The repair LED 300' may be connected to the backplane 100 by using the soldering method using a metal ink or the ACF 120 again.

In operation S344, a wiring connected to the defective LED may be disconnected, for example the wiring may be cut. Alternatively, the defective LED 300 may be removed.

The above-described embodiment has been described based on a single pixel including the plurality of LEDs. A plurality of the single pixels may be formed in an array of M×N to form the unit module 10, and the plurality of unit modules 10 may be mounted on the cabinet 21 to manufacture a large-area display apparatus 1. Alternatively, it is possible to manufacture the display apparatus 1 in which a single pixel rather than a module unit is formed in in an array of M×N.

Further, after the LED 300 or the LED 300 and the repair LED 300' are mounted on the backplane 100, a transparent layer configured to protect the LED 300 or the LED 300 and the repair LED 300' may be formed.

Because the LEDs forming a single pixel are arranged in the first direction (the width direction) of the LED, and the repair anode pad or the repair cathode pad for the single LED is arranged in the second direction (the length direction) with respect to the anode pad, the arrangement of components included in the single pixel may be optimized and thus it is possible to minimize the size of the single pixel and to realize high resolution.

As is apparent from the above description, the display apparatus and the manufacturing method of the same may reduce the size of the pixel and realize high resolution by optimizing arrangement between the LEDs forming the pixel and the electrode pads electrically connected to the LEDs.

In addition, as a single unit, the display module may be installed and applied to electronic products or electronic equipment that require a display such as a wearable device, a portable device, and a handheld device. Further, the plurality of display modules may be assembled in the form of matrix and then applied to a display apparatus such as a personal computer monitor, a high-definition TV, and a digital signage.

Although a few embodiments have been shown and described, it should be appreciated by those skilled in the art that changes may be made in these embodiments without departing from the principles and spirit of the disclosure, the scope of which is defined in the claims and their equivalents.

What is claimed is:

1. A display apparatus comprising:
a substrate;
a plurality of light emitting diodes (LEDs) disposed on the substrate to form a pixel, and spaced apart from each other along a width direction of one of the plurality of LEDs;
a plurality of anode pads disposed on the substrate and spaced apart from each other along the width direction;
at least one cathode pad disposed on the substrate and spaced apart from the plurality of anode pads along a length direction that crosses the width direction;
a plurality of repair anode pads disposed on the substrate, spaced apart from each other along the width direction, and spaced apart from the plurality of anode pads and the at least one cathode pad along the length direction; and
wherein each of the plurality of LEDs comprises an anode that is electrically connected to a corresponding anode pad from among the plurality of anode pads and a cathode that is electrically connected to the at least one cathode pad,
wherein the anode is formed on one end of an LED of the plurality of LEDs and the cathode is formed on the other end of the LED of the plurality of LEDs in the length direction, and
wherein the at least one cathode pad is interposed between the plurality of anode pads and the plurality of repair anode pads.

2. The display apparatus of claim 1, wherein the at least one cathode pad comprises a single cathode pad commonly connected to the cathode of each of the plurality of LEDs.

3. The display apparatus of claim 1, wherein the at least one cathode pad comprises a shared cathode pad commonly connected to the cathode of at least two of the plurality of LEDs.

4. The display apparatus of claim 3, wherein the plurality of LEDs comprises a red LED, a green LED and a blue LED,
wherein the plurality of anode pads comprises a first anode pad corresponding to the red LED, a second anode pad corresponding to the green LED and a third anode pad corresponding to the blue LED,
wherein the plurality of repair anode pads comprises a first repair anode pad corresponding to the red LED, a second repair anode pad corresponding to the green LED and a third repair anode pad corresponding to the blue LED, and
wherein the at least one cathode pad comprises:
a first cathode pad electrically connected to the green LED and the blue LED, interposed between the second anode pad and the second repair anode pad, and interposed between the third anode pad and the third repair anode pad; and
a second cathode pad electrically connected to the cathode of the red LED, and interposed between the first anode pad and the first repair anode pad.

5. The display apparatus of claim 4, wherein a first reference voltage is provided to the first cathode pad and a second reference voltage, which is higher than the first reference voltage, is provided to the second cathode pad.

6. The display apparatus of claim 4, further comprising:
an upper insulating layer disposed on the plurality of anode pads and the plurality of repair anode pads,
wherein a connection hole is formed through the upper insulating layer to expose the plurality of anode pads and the plurality of repair anode pads.

7. The display apparatus of claim 6, wherein the anode of each of the plurality of LEDs is electrically connected to the corresponding anode pad exposed through the connection hole.

8. The display apparatus of 6, further comprising:
a repair LED corresponding to a defective LED from among the red LED, the green LED and the blue LED,
wherein a repair anode pad, from among the first repair anode pad, the second repair anode pad and the third repair anode pad corresponding to the defective LED, from among the plurality of repair anode pads, is electrically connected to a part of the repair anode pad which is exposed through the connection hole.

9. The display apparatus of claim 1, wherein each of the plurality of LEDs is configured to emit light toward away from the substrate.

10. A display apparatus comprising:
a substrate;
a plurality of light emitting diodes (LEDs) disposed on the substrate to form a pixel, and spaced apart from each other along a width direction of one of the plurality of LEDs;
a plurality of anode pads disposed on the substrate and spaced apart from each other along the width direction;
at least one cathode pad disposed on the substrate and spaced apart from the plurality of anode pads along a length direction that crosses the width direction; and
at least one repair cathode pad disposed on the substrate and spaced apart front the plurality of anode pads and the at least one cathode pad along the length direction;
wherein each of the plurality of LEDs comprising an anode that is electrically connected to a corresponding anode pad from among the plurality of anode pads and a cathode that is electrically connected to the at least one cathode pad,
wherein the anode is formed on one end of an LED of the plurality of LEDs and the cathode is formed on the other end of the LED of the plurality of LEDs in the length direction, and
wherein the plurality of anode pads is interposed between the at least one cathode pad and the at least one repair cathode pad.

11. The display apparatus of claim 10, further comprising:
a plurality of driving transistors disposed on an upper side of the substrate and corresponding to the plurality of LEDs, respectively,
wherein each of the plurality of anode pads is electrically connected to a drain electrode of a corresponding driving transistor from among the plurality of driving transistors, and
wherein the at least one cathode pad is connected to a reference voltage.

12. The display apparatus of claim 10, further comprising:
an upper insulating layer disposed on the plurality of anode pads, the at least one cathode pad and the at least one repair cathode pad, wherein a connection hole is formed through the upper insulating layer to expose the plurality of anode pads, the at least one cathode pad, and the at least one repair cathode pad.

13. The display apparatus of claim 12, wherein the anode of each of the plurality of LEDs is electrically connected to the plurality of anode pads exposed through the connection hole, and wherein the cathode of each of the plurality of LEDs is electrically connected to the at least one cathode pad exposed through the connection hole.

14. The display apparatus of claim 13, further comprising a repair LED corresponding to a defective LED, wherein a cathode of the repair LED is electrically connected to the at least one repair cathode pad, which is exposed through the connection hole, corresponding to the defective LED, and wherein an anode of the repair LED is electrically connected to the corresponding anode pad, which is exposed through the connection hole, from among the plurality of anode pads that corresponds to the defective LED.

15. The display apparatus of claim 12, further comprising a plurality of driving transistors disposed on an upper side of the substrate and corresponding to the plurality of LEDs, respectively, wherein the at least one cathode pad is electrically connected to a drain electrode of each of the plurality of driving transistors, and wherein the plurality of anode pads is connected to a power voltage.

16. The display apparatus of claim 15, wherein the power voltage comprises a first power voltage and a second power voltage that is lower than the first power voltage, wherein the plurality of LEDs comprises a red LED, a green LED and a blue LED, wherein the first power voltage is provided to the anode of the green LED and the anode of the blue LED, and wherein the second power voltage is provided to the anode of the red LED.

* * * * *